(12) United States Patent
Ichihara et al.

(10) Patent No.: US 9,424,919 B2
(45) Date of Patent: Aug. 23, 2016

(54) SEMICONDUCTOR STORAGE DEVICE

(71) Applicant: KABUSHIKI KAISHA TOSHIBA, Tokyo (JP)

(72) Inventors: Reika Ichihara, Yokohama Kanagawa (JP); Kikuko Sugimae, Kuwana Mie (JP); Takayuki Miyazaki, Setagaya Tokyo (JP); Yoshihisa Iwata, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 14/626,579

(22) Filed: Feb. 19, 2015

(65) Prior Publication Data

US 2015/0162083 A1 Jun. 11, 2015

Related U.S. Application Data

(63) Continuation of application No. 14/017,250, filed on Sep. 3, 2013, now Pat. No. 8,995,168.

(30) Foreign Application Priority Data

Mar. 15, 2013 (JP) ................. 2013-052785

(51) Int. Cl.
*G11C 11/00* (2006.01)
*G11C 13/00* (2006.01)

(52) U.S. Cl.
CPC ........ *G11C 13/0069* (2013.01); *G11C 13/0002* (2013.01); *G11C 13/0007* (2013.01); *G11C 13/0023* (2013.01); *G11C 13/0038* (2013.01); *G11C 13/0064* (2013.01); *G11C 13/0097* (2013.01); *G11C 2013/0073* (2013.01)

(58) Field of Classification Search
None
See application file for complete search history.

(56) References Cited

U.S. PATENT DOCUMENTS

| 2009/0046495 | A1 | 2/2009 | Shimaoka et al. |
| 2011/0176351 | A1 | 7/2011 | Fujitsuka et al. |
| 2012/0014164 | A1 | 1/2012 | Kamoshida et al. |
| 2014/0321194 | A1* | 10/2014 | Sonehara ........... G11C 13/0064 365/148 |

FOREIGN PATENT DOCUMENTS

JP 2012-203926 A 10/2012

* cited by examiner

*Primary Examiner* — Kretelia Graham
(74) *Attorney, Agent, or Firm* — Patterson & Sheridan, LLP

(57) ABSTRACT

According to one embodiment, provided is a semiconductor storage device that includes a control circuit to control the voltage that is applied to the memory cell. The control circuit is configured to execute a reset operation that applies a reset voltage of a first polarity to a selected memory cell that is connected to a selected first wire and a selected second wire during a reset operation. The control circuit is configured to execute a cancel operation that applies a cancel voltage of a second polarity that is opposite to the first polarity to an unselected memory cell and at the same time can execute a verify operation that reads out the state of the selected memory cell by applying a readout voltage of the second polarity to the selected memory cell. The cancel voltage and the readout voltage are the same voltage value.

21 Claims, 23 Drawing Sheets

FIG. 7
SET OPERATION
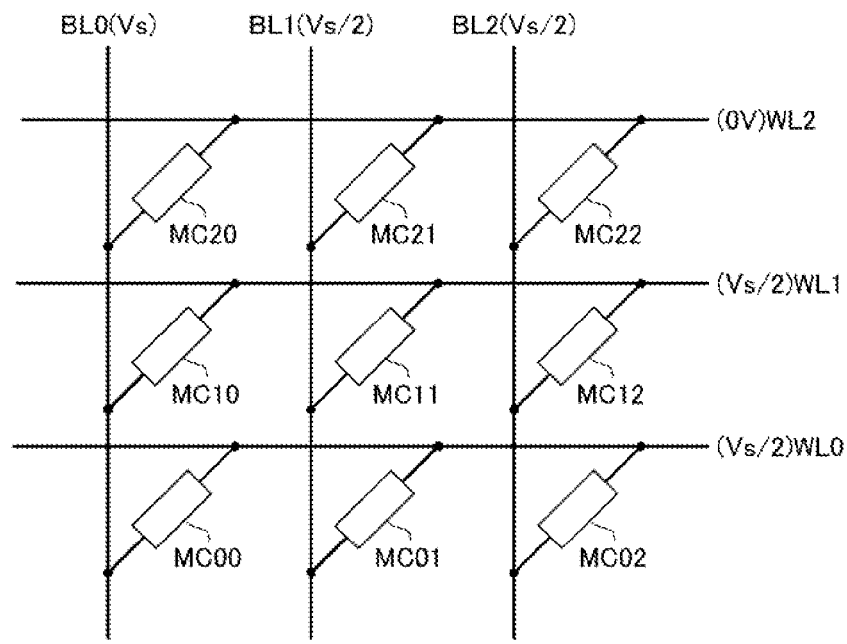
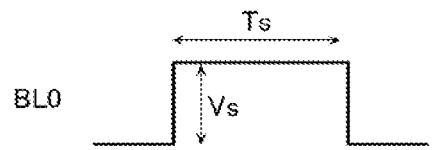
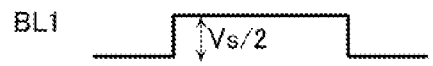
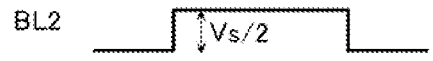
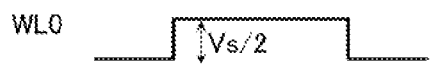
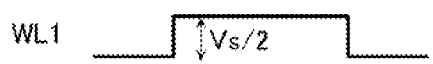

FIG. 9
RESET OPERATION
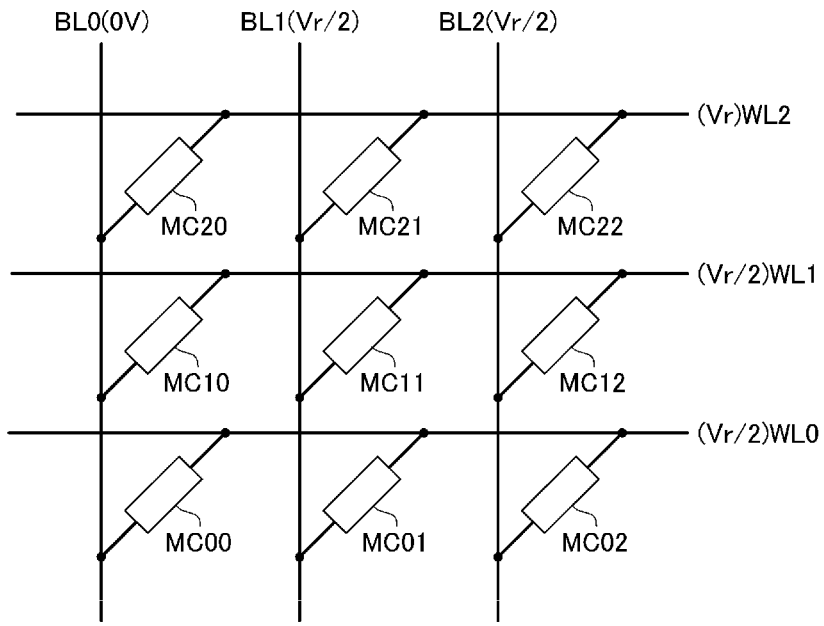
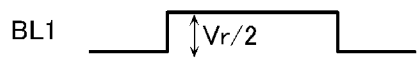
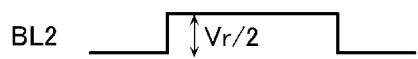
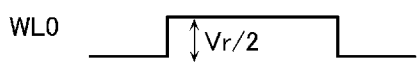
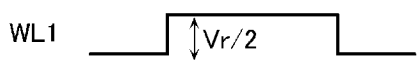
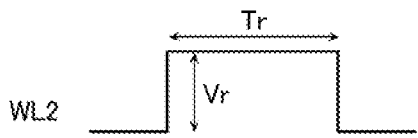

SEMICONDUCTOR STORAGE DEVICE

CROSS-REFERENCE TO RELATED APPLICATION

This application is a continuation of co-pending U.S. patent application Ser. No. 14/017,250, filed Sep. 3, 2013 which is based upon and claims the benefit of priority from Japanese Patent Application No. 2013-052785, filed Mar. 15, 2013. Each of the aforementioned related patent applications is hereby incorporated herein by reference.

FIELD

Embodiments described herein relate generally to a semiconductor storage device that includes memory cells, which each use variations in the resistance value of a variable resistance element to store data.

BACKGROUND

In recent years, resistance random access memory devices that use variable resistance elements as storage elements have attracted attention as a candidate for the successor of flash memory. Here, resistance random access memory devices shall include not only resistance random access memory in the narrow sense, in which transition metal oxides comprise the recording layers and their resistance value state is recorded in a nonvolatile manner (ReRAM: Resistive RAM), but also phase-change memory (PCRAM: Phase-Change RAM), which uses chalcogenides, etc., as the recording layer(s), which utilizes the resistance value shift between its crystalline state (a conductor) and its amorphous state (an insulator) to store information.

In the memory cell array of the resistance random access memory device, memory cells that include variable resistance elements are placed at the intersection of the bit line and the word line. Also, by alternately layering the bit line and the word line and by stacking and arranging the memory cell array three-dimensionally, a high-density memory cell array can be realized.

When applying a voltage to a selected memory cell, which is large enough to change its resistance state, there are cases where the voltage is also undesirably applied to other half-selected memory cells in the memory cell array. The resistance state of the half-selected memory cell is affected by this voltage, and there is a concern that data retained in the half-selected memory cell will be undesirably changed. Unselected memory cells may have similar problems, when applying voltages to bit lines and word lines have undesirable different timings.

DESCRIPTION OF THE DRAWINGS

FIG. 7 is a diagram that illustrates the voltage application levels in a memory cell array during the set operation of the first embodiment.

FIG. 9 is a diagram that shows the voltage application state during a reset operation according to the first embodiment.

DETAILED DESCRIPTION

Figure 1:
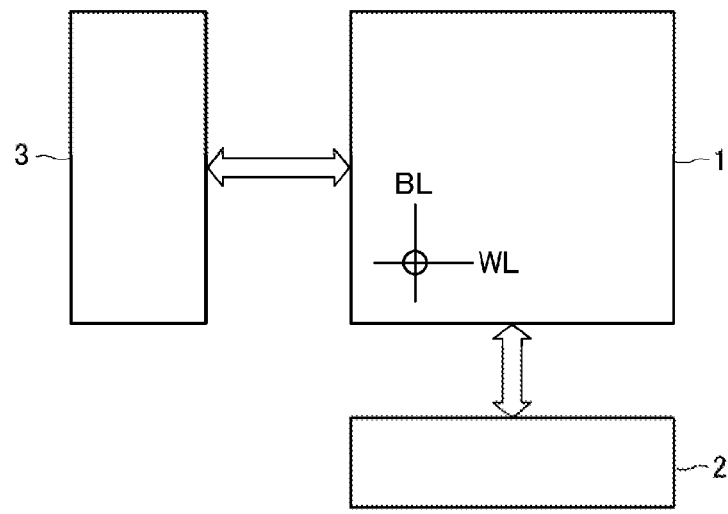
FIG. 1 is a block diagram of a semiconductor storage device according to a first embodiment.

Embodiments provide a semiconductor storage device that can suppress the fluctuation in the resistance state of the memory cell.

In general, the embodiments of the present disclosure are described with reference to the drawings. Meanwhile, in the descriptions in the drawings of the embodiments, parts that have the same configuration will be given the same reference notations, and their redundant descriptions will be omitted.

Some embodiment of the invention may include a semiconductor storage device that has multiple first wires, multiple second wires that extend to intersect with the first wires, multiple memory cells that are placed in each intersection part of the first wires and the second wires and that includes a variable resistance element, and a control circuit that controls the voltage applied to the memory cell.

The control circuit is configured so that, during a reset operation when the variable resistance element is changed to a reset state that is conducted at a first voltage, the control circuit can execute a reset operation that applies a reset voltage of a first polarity to a selected memory cell connected to a selected first wire and a selected second wire.

The control circuit is connected to either the selected first wire or the selected second wire and is configured so that a cancel operation that applies a cancel voltage of a second polarity opposite to the first polarity is executed to the half-selected memory cell to which voltage that is less than the reset voltage is applied during the reset operation, and at the same time, can execute a verify operation that reads out the state of the selected memory cell by applying a readout voltage of the second polarity to the selected memory cell.

The cancel voltage and the readout voltage have the same voltage value (e.g., same sign and same magnitude).

Overall Structure

FIG. 1 is a block diagram that shows a configuration of a nonvolatile memory according to the first embodiment of the present invention. This nonvolatile memory includes a memory cell array 1 wherein memory cells that use variable resistance elements VR described later are arranged in a matrix.

A column control circuit 2 that controls the voltage of a bit line BL is electrically connected to the bit line BL of the memory cell array 1 in order to select the bit line BL of the memory cell array 1 and carry out a data erase operation of the memory cell, a data write operation to the memory cell and a data readout operation from the memory cell. A row control circuit 3 that controls the voltage of a word line WL is electrically connected to the word line WL of the memory cell array 1 in order to select the word line WL of the memory cell array 1 and carry out the data erase operation of the memory cell, the data write operation to the memory cell and the data read operation from the memory cell.

Memory Cell Array 1

Figure 2:
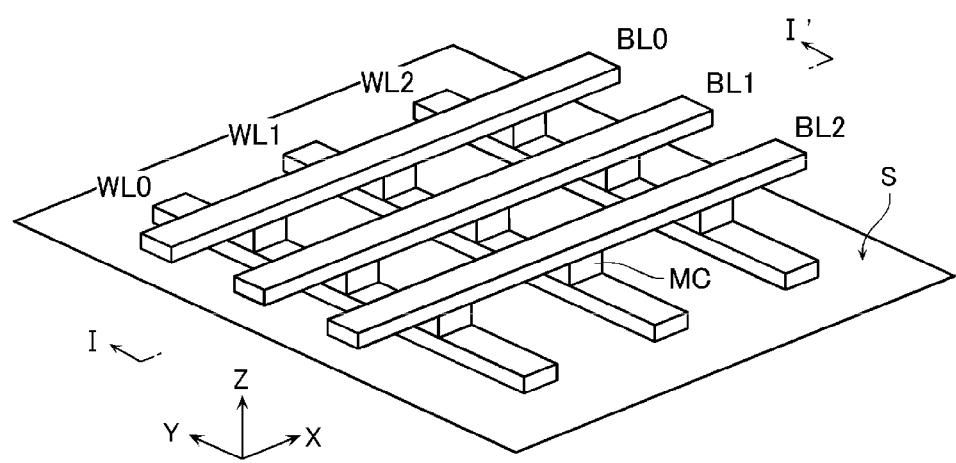
FIG. 2 is an isometric view of a portion of a memory cell array according to one embodiment.
Figure 3:
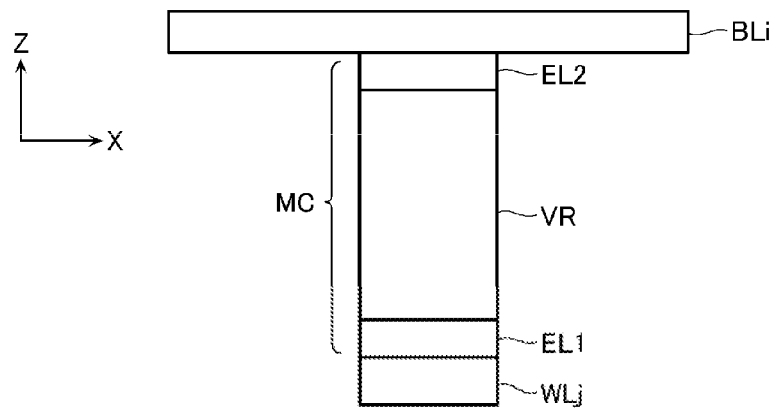
FIG. 3 is a cross-sectional view of a memory cell as seen in the direction of the arrow by cutting along the I-I' line shown in FIG. 2 according to one embodiment.

FIG. 2 is an isometric view of part of the memory cell array 1, and FIG. 3 is a cross-sectional diagram of one memory cell as seen in an arrow direction by cutting along a I-I' line in FIG. 2. Word lines WL0 to WL2 are arranged in a Y-direction that is parallel to a surface of a semiconductor substrate S as multiple first wires. Bit lines BL0 to BL2 are arranged in an X-direction that is parallel to the surface of the semiconductor substrate S as multiple second wires so as to intersect with the word lines WL. A memory cell MC is placed at each intersection of the word lines WL0 to WL2 and the bit lines BL0 to BL2 so that the memory cell is sandwiched by both wires. Materials of the first and the second wires are preferably materials that are resistant to heat and have low resistance values and, for example, may include tungsten (W), tungsten nitride (WN), tungsten silicide (WSi), nickel silicide (NiSi), and cobalt (CoSi), etc. can be used.

Memory Cell MC

As shown in FIG. 3, the memory cell MC is a circuit in which the variable resistance element VR is connected between a bit line BL (e.g., bit line BLi) and the word line WL (e.g., word line WLj). Above and below in a Z-direction of the variable resistance elements VR are placed electrodes EL1 and EL2 that function as barrier metals and as an adhesion layer. A variable resistance element VR is placed on the electrode EL1, and the electrode EL2 is placed on the variable resistance elements VR. Regarding the electrode material of the electrode EL2, materials that include a metal element that makes up a conductive filament are used. Metal elements used for the electrode EL2 can be selected from, for example, Ag, Ni, Co, Al, Zn, Ti, Ta, and Cu, etc. The electrode EL2 can also have further layered on the electrode materials such as silicon, W, Ti, $TiN_x$, $TiSi_x$, $TiSi_xNy$, Ta, $TaN_x$, and $TaSi_xNy$ that may contain dopants. Various metal elements can be used for the electrode EL1 and can be, for example, selected from materials such as silicon, W, Ti, $TiN_x$, $TiSi_x$, $TiSi_xNy$, Ta, $TaN_x$, and $TaSi_xNy$ that may contain dopants and/or be formed in a laminate structure.

Variable Resistance Elements

For the variable resistance elements VR, a substance that can change the resistance value by applying voltage via electrical field, electric current, heat, and chemical energy, etc. can be used. The variable resistance elements VR are formed of, for example, a film including silicon oxide ($SiO_x$) as the base material. Specifically, the variable resistance elements VR are formed of a film consists of a single-layer film of silicon oxide ($SiO_x$) or a structure in which silicon oxide ($SiO_x$) and a semiconductor or an insulator are layered. Examples of semiconductors or insulators that are layered on the silicon oxide ($SiO_x$) include silicon (Si), hafnium oxide ($HfO_x$), etc. The variable resistance elements VR of the present embodiment have different current-voltage characteristics, depending on its state. Utilizing this, the variable resistance elements VR can be used as a selected memory element.

Memory Cell Array and the Peripheral Circuit

Figure 4:
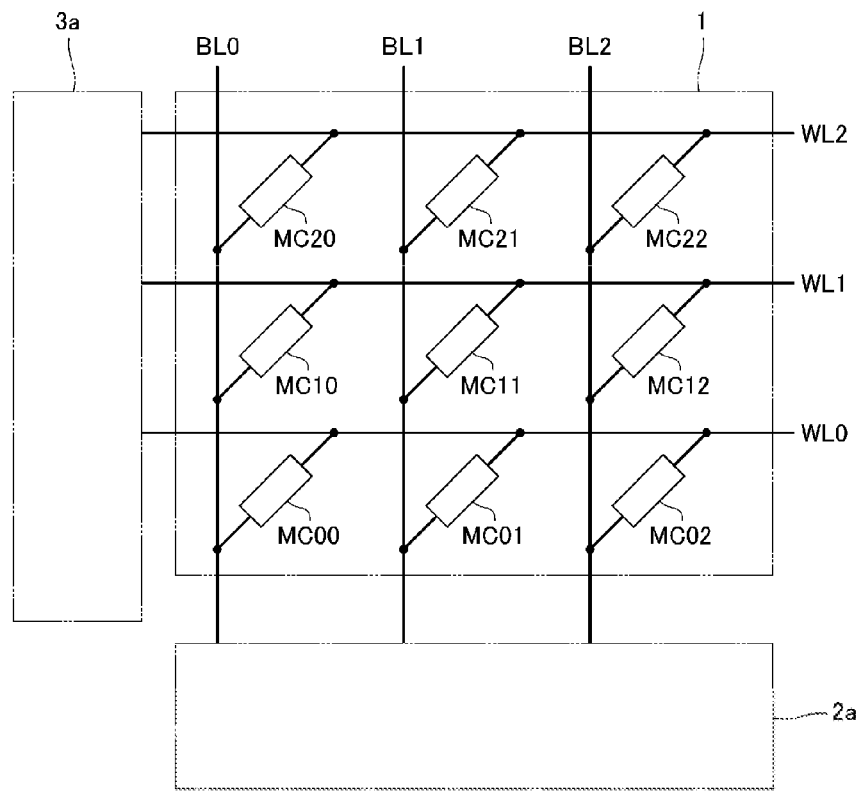
FIG. 4 is a circuit diagram illustrating interconnected memory cells in a memory cell array according to one embodiment.

FIG. 4 is a circuit diagram of the peripheral circuit of the memory cell array 1. One end of each bit line BL is connected to a column peripheral circuit 2a, which is one part of a column control circuit 2. Also, one end of each word line WL is connected to a row peripheral circuit 3a, which is one part of a row control circuit 3. With this column peripheral circuit 2a and the row peripheral circuit 3a, the voltage necessary for the operation is supplied to the bit line BL and the word line WL. It is possible to add the different functions necessary for the operation and control of the bit line BL and the word line WL to the column peripheral circuit 2a and the row peripheral circuit 3a, respectively.

Hereinafter, a case when voltage is applied so that, with respect to the memory cell MC, the bit line BL is high voltage and the word line WL is low voltage, the case may be expressed such that a positive polarity (a first polarity) voltage is applied; a case when voltage is applied so that, with respect to the memory cell MC, the bit line BL is low voltage and the word line WL is high voltage, the case may be expressed such that a negative polarity (a second polarity) voltage is applied. In this case, the voltage that is applied to the positive polarity with respect to the memory cell MC is shown as a positive voltage, and the voltage that is applied to the negative polarity with respect to the memory cell is shown as a negative voltage.

Operation of the Memory Cell

Figure 5:
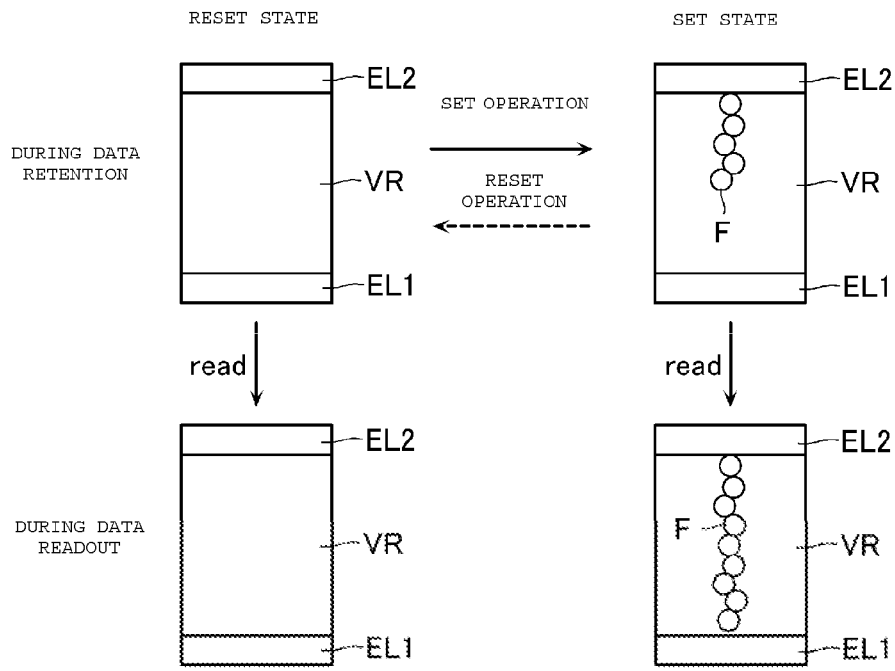
FIG. 5 is a schematic diagram that illustrates the operating method of the memory cell according to one embodiment.

FIG. 5 is a diagram that explains an operation method of the memory cell MC that includes the variable resistance elements VR.

By applying a set voltage for a set time to the variable resistance elements VR of the selected memory cell MC, the variable resistance elements VR of the selected memory cell MC are changed to a set state. This operation that changes the variable resistance elements VR to the set state is called a set operation. The set state is a state wherein part of the conductive filament F that electrically connects the electrode EL1 and electrode EL2 is disconnected.

On the other hand, by applying a set voltage for a set time to the variable resistance elements VR of the selected memory cell MC, the variable resistance elements VR of the selected memory cell MC are changed to the reset state that is conducted at a voltage higher than the set voltage. This operation that changes the variable resistance elements VR to the reset state is called a reset operation. The reset state is a state wherein the length of the conductive filament F is shorter than that in the set state.

During the readout operation, a set readout voltage is applied to the variable resistance elements VR of the selected memory cell MC. By applying the readout voltage, the conductive filament F is extended towards the electrode EL1 side, but the readout voltage, which causes the conductive filament F to extend towards the electrode EL1, creates a filament F that differs in length from the filaments F created in the set state and the reset state. Utilizing this difference, it is possible to read the state of the selected memory cell MC.

Figure 6:
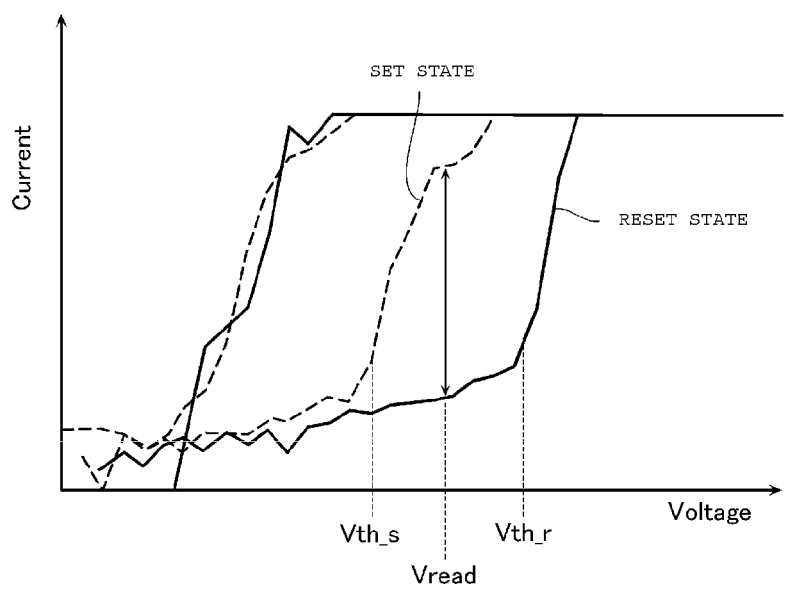
FIG. 6 is a current versus voltage diagram that illustrates the data retention states of a memory cell according to one embodiment.

FIG. 6 is a diagram that explains a data retention state of the memory cell. FIG. 6 shows the electrical characteristics of the variable resistance elements VR in the set state and the reset state. FIG. 6 is an example of a case wherein silver (Ag) is used for the electrode EL2 and silicon oxide ($SiO_x$) is used as the base material of the variable resistance elements VR. In FIG. 6, the current-voltage characteristics of the set state are shown by the dashed line, and the current-voltage characteristics of the reset state are shown by the solid line.

When the memory cell MC is in the set state, and a voltage greater than or equal to a voltage $Vth\_s$ is applied, a large amount of current is passed. On the other hand, when the memory cell MC is in the reset state, and a voltage that is greater than or equal to the voltage $Vth\_r$ is applied, a large amount of current is passed. In this case, the magnitude of voltage $Vth\_s$ is smaller than voltage $Vth\_r$, and if a voltage Vread that satisfies $Vth\_s \leq Vread < Vth\_r$ is considered the readout voltage, a large current differential is generated between the set state and the reset state during the application of the readout voltage Vread. Based on this current differential, the resistance state of the memory cell MC is determined and is used as data.

Here, by controlling the applied voltage during the readout operation, a voltage smaller than voltage $Vth\_s$ will be applied to the half selected and unselected memory cell MC during the readout operation. Accordingly, only an extremely small current will pass through the half selected and unselected memory cell MC, and, thus the half selected and unselected memory cell MC will retain its desired memory state.

Next, a detailed explanation of the set operation and the reset operation with respect to the memory cell MC will be described.

Set Operation

The set operation according to the present embodiment is described with reference to FIG. 7 and FIG. 8. Here, the set operation in the present embodiment shall be an operation wherein a set voltage of a positive polarity is applied to the selected memory cell MC, and the variable resistance elements VR are changed to the set state. The set operation is described below.

FIG. 7 is a diagram that shows a voltage application state during the set operation of the present embodiment. FIG. 7 shows the voltage application state when the set operation is executed to one layer of the memory cell array 1. FIG. 8 is a waveform diagram of a voltage that is applied to the memory cell MC during the set operation of the present embodiment. In the present embodiment, an example of executing a set operation wherein the memory cell MC20 that is connected to the bit line BL0 and the word line WL2 is considered the selected memory cell MC is described. Also, memory cells MC21, MC22, MC10, and MC00 that are connected to either the selected bit line BL0 or the selected word line WL2 are called the half-selected memory cells MC, and the memory cells MC11, MC12, MC01, and MC02 that are not connected to either the selected bit line BL0 or the selected word line WL2 are called the unselected memory cells MC.

As shown in FIG. 7, a set voltage Vs that can change the variable resistance elements VR from the reset state to the set state is applied to the selected bit line BL0. The electric potential of the selected word line WL2 shall be 0 V. A voltage Vs/2, which is half of the set voltage Vs, is applied to the unselected bit lines BL1 and BL2. Also, a voltage Vs/2, which is half of the set voltage Vs, is applied to the unselected word lines WL0 and WL1. The application time of these voltages is a set voltage application time Ts. A voltage application time (a voltage pulse width) shall be the time from when a voltage which is applied to a set wire exceeds a half of a desired value to the time when the voltage falls below the half of the desired value. For example, the set voltage application time during the set operation is calculated based on the time from when the voltage of the selected bit line BL0 exceeds voltage Vs/2 to when the voltage falls below voltage Vs/2.

Figure 8:
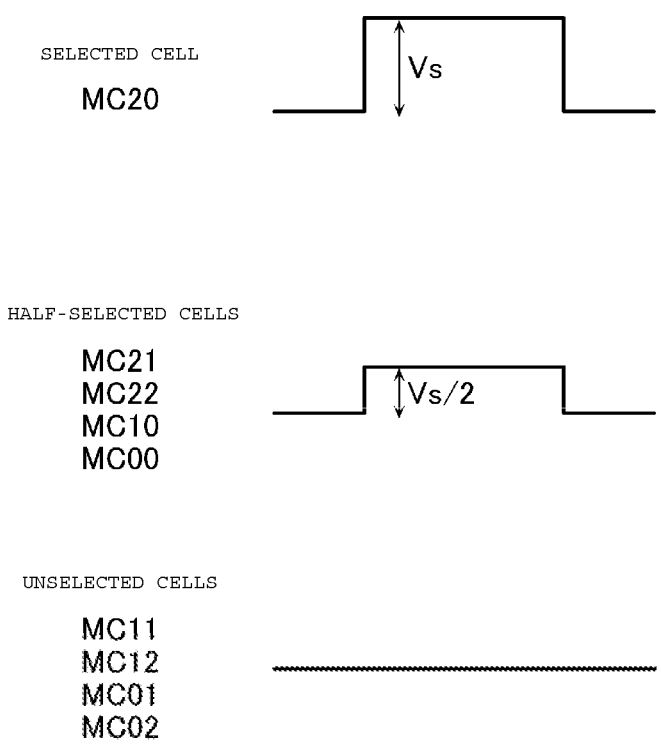
FIG. 8 is a voltage waveform diagram illustrating the voltages applied during a set operation of the first embodiment.

As shown in FIG. 8, with the voltage application during the set operation, a set voltage Vs of a positive polarity necessary for the set operation is applied to the selected memory cell MC20. With this, the selected memory cell MC20 has the variable resistance elements VR changed from the reset state to the set state. Also, a voltage Vs/2 of a positive polarity is applied to the half-selected memory cells MC21, MC22, MC10, and MC00. With this voltage Vs/2, since a set operation is not generated in the half-selected memory cells MC21, MC22, MC10, and MC00, the half-selected memory cells MC21, MC22, MC10, and MC00 are maintained in the same state as prior to the set operation. Since voltage is not applied to the unselected memory cells MC11, MC12, MC01, and MC02, the unselected memory cells MC11, MC12, MC01, and MC02 are maintained in the same state as prior to the set operation.

Reset Operation

The reset operation according to the present embodiment is described with reference to FIGS. 9 and 10. Here, the reset operation in the present embodiment shall be an operation wherein a reset voltage of a negative polarity is applied to the selected memory cell MC and the variable resistance element VR is changed to the reset state. The reset operation is described below.

FIG. 9 is a diagram that shows the voltage application state during the reset operation of the present embodiment. FIG. 10 is a waveform diagram of the voltage that is applied to the memory cell MC during the reset operation of the present embodiment. In the present embodiment, an example of executing the reset operation is described, wherein the memory cell MC20 that is connected to the selected bit line BL0 and the selected word line WL2 is considered the selected memory cell MC.

As shown in FIG. 9, a reset voltage Vr that can change the variable resistance elements VR from the set state to the reset state is applied to the selected word line WL2. The electric potential of the selected bit line BL0 shall be 0 V. A voltage Vr/2, which is half of the reset voltage Vr, is applied to the unselected bit lines BL1 and BL2. Also, a voltage Vr/2, which is half of the reset voltage Vr, is applied to the unselected word lines WL0 and WL1. The application time of these voltages is a reset voltage application time Tr.

Figure 10:
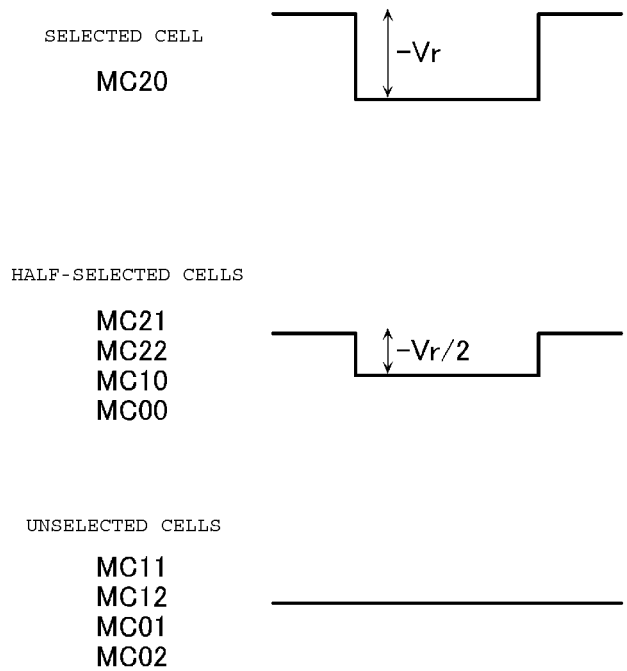
FIG. 10 is a voltage waveform diagram illustrating the voltages applied during a reset operation according to one embodiment.

As shown in FIG. 10, with the voltage application during the reset operation, a reset voltage −Vr of a negative polarity necessary for the reset operation is applied to the selected memory cell MC20. By applying the reset voltage −Vr, the selected memory cell MC20 has the variable resistance elements VR changed from the set state to the reset state. Also, a voltage −Vr/2 of a negative polarity is applied to the half-selected memory cells MC21, MC22, MC10, and MC00. Since only the voltage −Vr/2 is applied, a reset operation is not generated in the half-selected memory cells MC21, MC22, MC10, and MC00. Since voltage is not applied to the unselected memory cells MC11, MC12, MC01, and MC02, the unselected memory cells MC11, MC12, MC01, and MC02 are maintained in the same state as prior to the reset operation.

Verify Operation

After executing this reset operation, a verify operation to determine whether or not the selected memory cell MC changed into the desired state is carried out. In the verify operation, a voltage Vread is applied to the selected memory cell MC20 as the readout voltage, and the current that passes through the selected memory cell MC20 is detected. When the voltage Vread is applied to the memory cell MC, in the case when the memory cell MC is in a set state, a large amount of current passes through memory cell MC. On the other hand, when the memory cell MC is in the reset state, a smaller amount of current will pass through the memory cell MC. If the current that passes through the selected memory cell MC20 is less than an accepted value Ith, a determination is made that the selected memory cell MC20 is in the reset state, and the operation is ended. On the other hand, if the current that passes through the selected memory cell MC20 is greater than or equal to the accepted value Ith, a determination is made that the selected memory cell MC20 is in the set state, and the reset operation is executed again. Meanwhile, the control of the verify operation according to the present embodiment is mentioned below.

Figure 11:
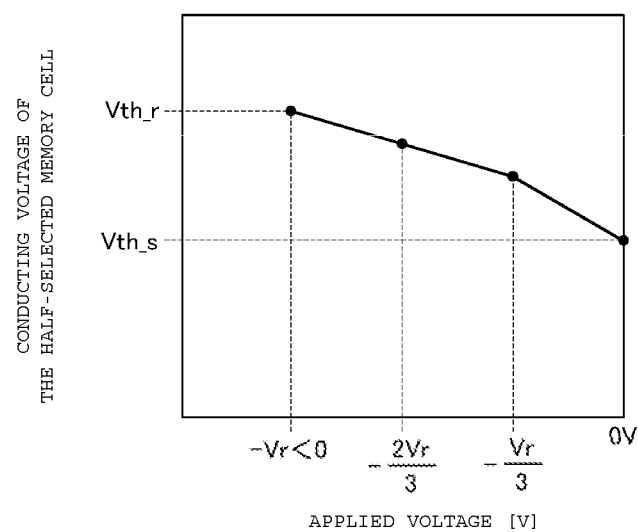
FIG. 11 is a diagram that illustrates the data retention state of a half-selected memory cell of the first embodiment.

Next, problems during the reset operation are described. FIG. 11 is a diagram that explains the data retention state of the half-selected memory cells MC during the reset operation.

During the reset operation, a voltage −Vr/2 of a negative polarity is applied to the half-selected memory cells MC21, MC22, MC10, and MC00 as described above. When this voltage −Vr/2 of a negative polarity is applied to the variable resistance elements VR in the set state, while a complete reset operation will not occur, there are cases when a slight state change occurs. The state change due to the voltage −Vr/2 of a negative polarity being applied to the variable resistance elements VR may be called a disturbance.

As shown in FIG. 11, when applying a voltage of a negative polarity to the variable resistance elements VR in the set state, the conduction voltage of the variable resistance elements VR can be changed. When no voltage is applied to the variable resistance elements VR (the applied voltage 0 V) their conduction voltage will not change. Also, when a reset voltage −Vr of a negative polarity is applied, a reset operation is carried out on the variable resistance elements VR that were in the set state, and the conduction voltage of the variable resistance elements VR is increased to a reset threshold Vth_r.

In contrast, in the semiconductor storage device of the present embodiment, the disturbance of the variable resistance element VR of the half-selected memory cells MC21, MC22, MC10, and MC00 is resolved by executing the cancel operation. Also, in the semiconductor storage device of the present embodiment, along with the cancel operation to the half-selected memory cells MC21, MC22, MC10, and MC00, a verify operation is executed on the selected memory cell MC20. The cancel operation and the verify operation according to the present embodiment is described with reference to FIGS. 12 and 13.

Cancel Operation and Verify Operation

The cancel operation in the present embodiment is an operation wherein a cancel voltage of a positive polarity is applied to the half-selected memory cell MC after the reset operation, and the disturbance of the variable resistance element VR is resolved. When a negative polarity voltage that is less than the reset voltage −Vr is applied to the variable resistance element VR, the conduction voltage of the variable resistance element VR becomes higher (a disturbance). By applying a cancel voltage that has a positive polarity to the variable resistance element VR, which has received this reset type disturbance, it is possible to lower the conduction voltage of the variable resistance element VR. Also, in the semiconductor storage device of the present embodiment, along with this cancel operation, a verify operation is executed on the selected memory cell MC20. The cancel operation and the verify operation are described below.

Figure 12:
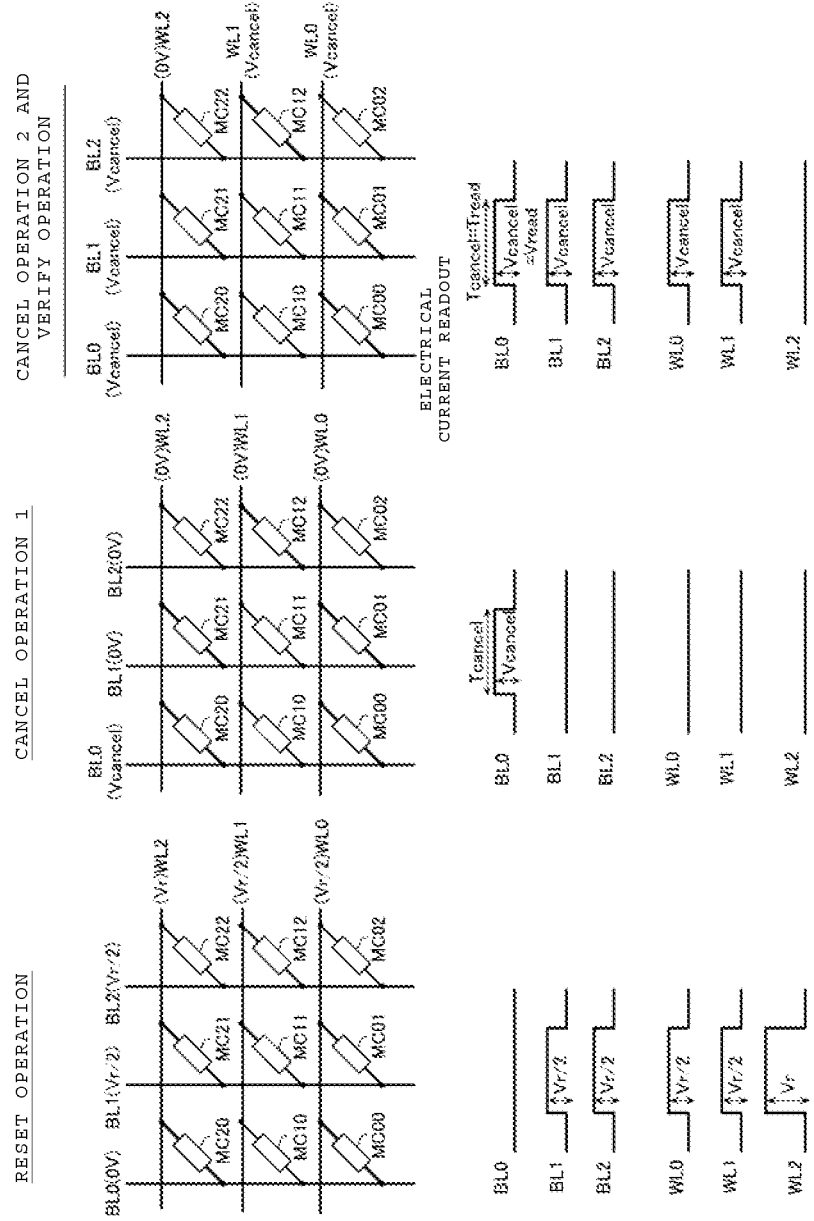
FIG. 12 is a diagram that shows the voltage application state(s) during a reset operation, a cancel operation, and a verify operation of the first embodiment.
Figure 13:
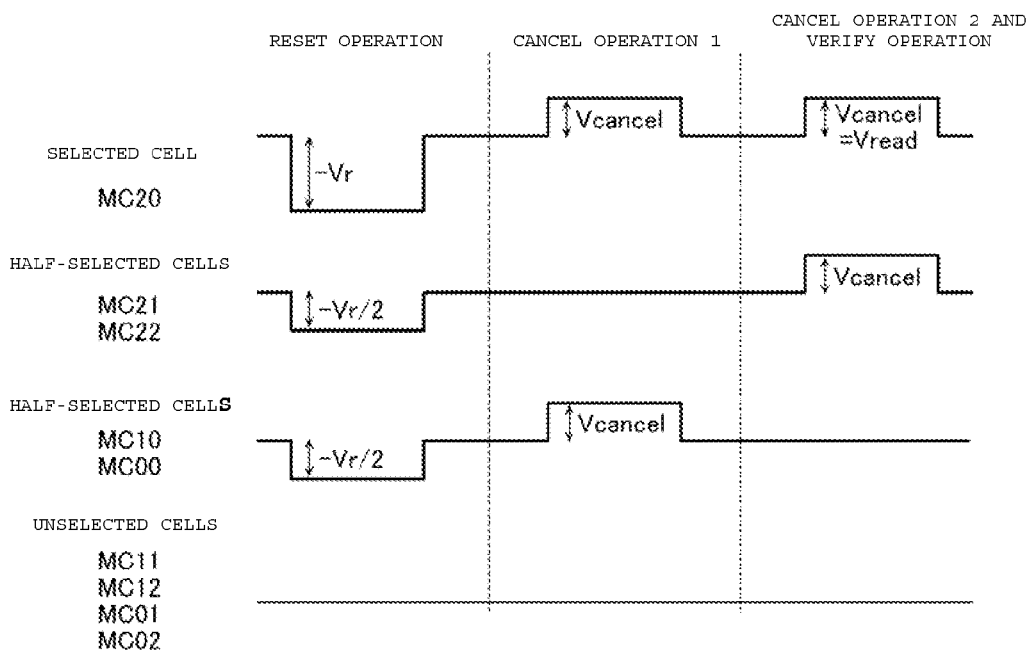
FIG. 13 is a voltage waveform diagram illustrating the voltages applied during a reset operation, a cancel operation, and a verify operation of the first embodiment.
Figure 14:
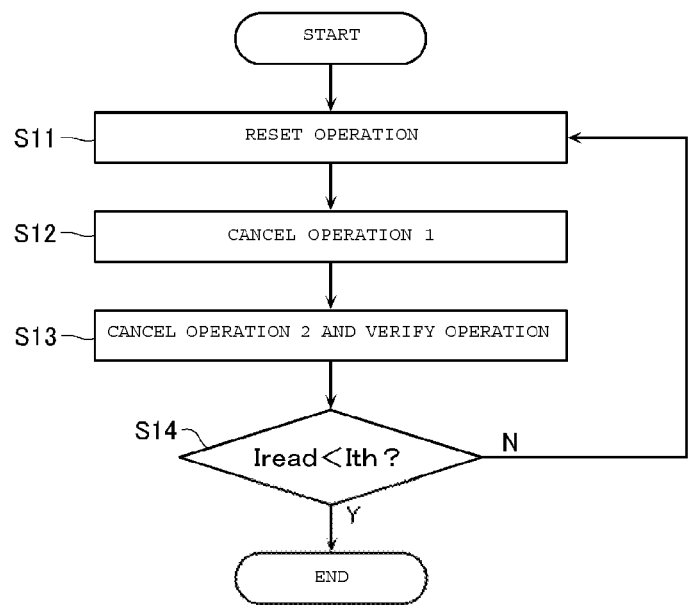
FIG. 14 is a flow chart that illustrates a process of using a memory cell of the first embodiment.

FIG. 12 is a diagram that shows the voltage application state during the reset operation, the cancel operation, and the verify operation of the present embodiment. The cancel operation and the verify operation of the present embodiment carry out the operations shown in FIG. 12 in sequence. FIG. 13 is a waveform diagram of the voltage that is applied to the memory cell MC during the reset operation, the cancel operation, and the verify operation of the present embodiment. FIG. 14 is a flowchart that illustrates a process of performing a reset operation, a cancel operation, and a verify operation according to one embodiment. In one example, when executing a cancel operation on the half-selected memory cells MC21, MC22, MC10, and MC00, a reset operation is executed on the memory cell MC20, which is connected to the selected bit line BL0 and the selected word line WL2.

Since the voltage application state during the reset operation shown in FIG. 12 is the same as the voltage application state shown in FIG. 9, the description is omitted.

In the cancel operation of the present embodiment, first, a cancel operation 1 is executed on the half-selected memory cells MC10 and MC00 to resolve the disturbance of the variable resistance element VR. Then, a cancel operation 2 is executed on the half-selected memory cells MC21 and MC22 to resolve the disturbance of the variable resistance element VR. This order may be changed arbitrarily.

First, as shown in FIG. 12, in the cancel operation 1, a cancel voltage Vcancel that can resolve the disturbance of the variable resistance element VR is applied to the bit line BL0. The electric potential of the bit lines BL1 and BL2, as well as the word lines WL0, WL1, and WL2, shall be 0 V. The application time of this voltage is the cancel voltage application time Tcancel.

As shown in FIG. 13, with the voltage application during the cancel operation 1, a cancel voltage Vcancel of a positive polarity necessary for the cancel operation is applied to the half-selected memory cells MC10 and MC00. Therefore, the half-selected memory cells MC10 and MC00 will have the disturbance of the variable resistance element VR resolved. That is, the conduction voltage of the variable resistance element VR will be similar to when a voltage Vth_s is applied.

Here, a cancel voltage Vcancel of a positive polarity is applied to the selected memory cell MC20. However, even if a cancel voltage Vcancel is applied to the selected memory cell MC20 after the reset operation is completed, the reset state is adequate stable and does not change, and there will be no adverse effects on the selected memory cell MC20. Also, since voltage is not applied to the half-selected memory cells MC21 and MC22 or to the unselected memory cells MC11, MC12, MC01, and MC02, these memory cells MC will be maintained in the same state as prior to the cancel operation 1.

Next, as shown in FIG. 12, in the cancel operation 2 and the verify operation, a cancel voltage Vcancel that can resolve the disturbance of the variable resistance element VR is applied to the bit lines BL0, BL1 and BL2. The electric potential of the word line WL2 shall be 0 V. Also, the cancel voltage Vcancel is applied to the word lines WL0 and WL1. The application time of this voltage is the cancel voltage application time Tcancel.

As shown in FIG. 13, with the voltage application during the cancel operation 2, a cancel voltage Vcancel of a positive polarity necessary for the cancel operation is applied to the half-selected memory cells MC21 and MC22. With this, the half-selected memory cells MC21 and MC22 will have the disturbance of the variable resistance element VR resolved. That is, the conduction voltage of the variable resistance element VR is lowered to a value that is around the normal conduction voltage achieved when a voltage equal to Vth_s is applied to a memory cell MC.

Also, since voltage is not applied to the half-selected memory cells MC10 and MC00 or to the unselected memory cells MC11, MC12, MC01, and MC02, these memory cells MC will be maintained in the same state as prior to the cancel operation 2.

Here, a cancel voltage Vcancel of a positive polarity is applied to the selected memory cell MC20. This cancel voltage Vcancel is configured to be the same value as the voltage Vread that can read out data from the selected memory cell MC20. The phrase "same value" includes two numbers that have the same sign (e.g., positive or negative bias voltage) and magnitude. The voltage Vread is a voltage that can determine if the selected memory cell MC20 is in the set state or in the reset state. When this voltage Vread is applied, the current Iread that passes through the bit line BL0 is read and compared with the acceptance value Ith. If the electric current that passes through the selected memory cell MC20 is less than the acceptance value Ith, a determination is made that the selected memory cell MC20 has changed to the reset state, and the operation is ended. On the other hand, if the electric current that passes through the selected memory cell MC20 is greater than or equal to the acceptance value Ith, a determination is made that the selected memory cell MC20 is in the set state, and the reset operation is executed again. In this way, in the semiconductor storage device of the present embodiment, the cancel operation and the verify operation are executed at the same time. In this case, the cancel voltage application time Tcancel is equivalent to the readout voltage application time Tread.

Meanwhile, voltage is not applied to the half-selected memory cells MC10 and MC00 that are connected to the bit line BL0 that reads out the electric current value during this verify operation. For this reason, an electric current is not passed through the bit line BL via the half-selected memory cells MC10 and MC00, and the state of the selected memory cell MC20 can be accurately read.

FIG. 14 is a flow chart that explains the reset operation, the cancel operation, and the verify operation of the first embodiment. When the reset operation, the cancel operation, and the verify operation are started, the reset operation is executed in step S11. At this time, the voltage application state of the memory cell array 1 is in the state shown in FIG. 12. Next, the cancel operation 1 is executed in step S12. At this time, the voltage application state of the memory cell array 1 is in the state shown in FIG. 12. Additionally, the cancel operation 2 and the verify operation are executed in step S13. At this time, the voltage application state of the memory cell array 1 is in the state shown in FIG. 12.

In step S14, the electric current Iread that passes through the bit line BL0 via the selected memory cell MC20 during the verify operation and the acceptance value Ith are compared. If the electric current Iread is greater than or equal to the acceptance value Ith, a determination is made that the selected memory cell MC20 is in the set state, and the reset operation of the step S11 is executed again. On the other hand, if the electric current Iread is less than the acceptance value Ith, a determination is made that the selected memory cell MC20 has changed to the reset state, and the operation is ended.

Effects

In the semiconductor storage device according to the present embodiment, a reset operation, a cancel operation, and a verify operation are carried out. Due to the voltage application during the cancel operation, a cancel voltage Vcancel of a positive polarity that is necessary for the cancel operation is applied to the half-selected memory cells MC.

With this, the disturbance of the variable resistance element VR of the half-selected memory cells MC is resolved. Also, when executing the cancel operation on the half-selected memory cells MC, the cancel voltage Vcancel shall be made to be the same value as the readout voltage Vread. With this, the cancel operation of the half-selected memory cells MC and the verify operation of the selected memory cell MC are carried out at the same time. As a result, even when executing the verify operation to the memory cell array 1 after the reset operation, operating time is not required to complete the verify operation, so the operating time of the semiconductor storage device can be decreased.

Figure 17:
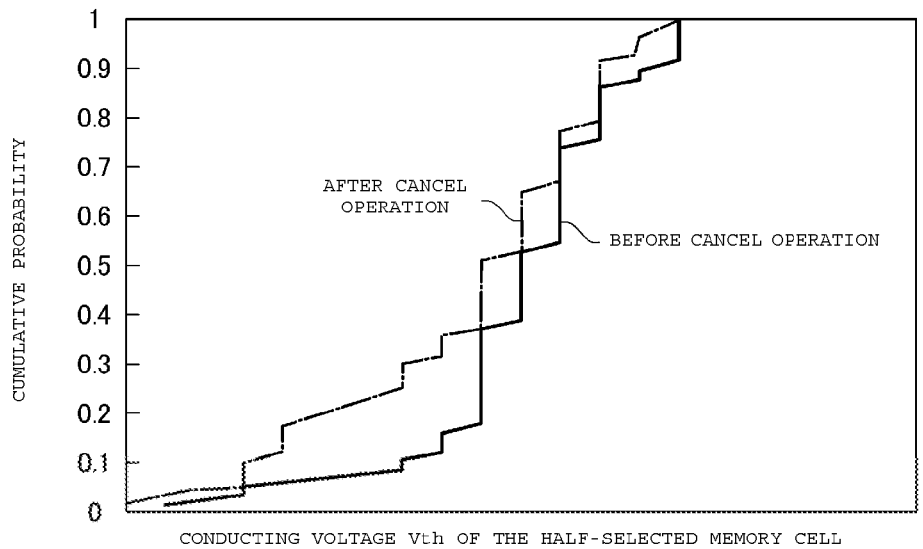
FIG. 17 is a graph that illustrates the effects of controlling the operation of a memory cell of the first embodiment.

FIG. 17 is a graph that shows the effects when the cancel operation of the present embodiment is carried out. In FIG. 17, the voltage Vth that the half-selected memory cells MC conduct before the cancel operation and after the cancel operation and the cumulative probability that represents the number of the half-selected memory cells MC that have a certain voltage Vth are shown. As shown in FIG. 17, after executing the cancel operation, memory cells that conduct at a low voltage Vth have increased in number. This indicates that it is possible to lower the conduction voltage of the variable resistance element VR to a conduction voltage around the normal conduction voltage achieved after applying a voltage Vth_s. Consequently, by executing the cancel operation, the disturbance of the variable resistance element VR of the half-selected memory cells MC is resolved. That is, it becomes possible to suppress the fluctuation in the resistance state of the memory cell MC that is caused by the reset operation.

Control Circuit of First Embodiment

Figure 15:
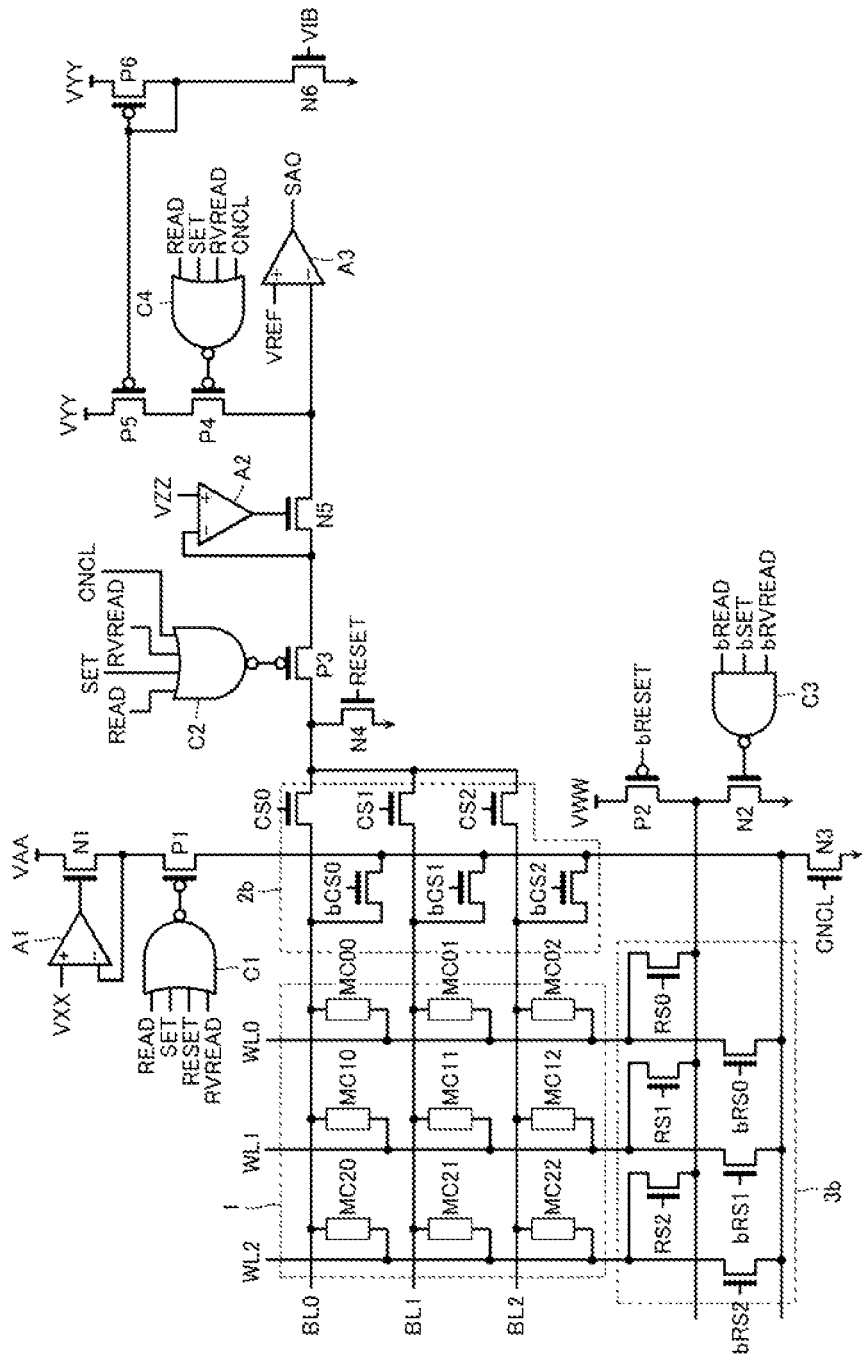
FIG. 15 is a schematic of a circuit used to control the operation of a memory cell of the first embodiment.

Next, the control circuit for executing the operation of the first embodiment is described with reference to FIG. 15. FIG. 15 is a circuit diagram of the control circuit that controls the operation of the embodiment. As shown in FIG. 15, the bit line BL and the word line WL of the memory cell array 1 are each connected to the bit line selected circuit 2b and the word line selected circuit 3b. The bit line selected circuit 2b and the word line selected circuit 3b are controlled by the column select signals CSn and bCSn (n=0-2) and the row select signals RSn and bRSn (n=0-2), and the bit line BL and the word line WL necessary for the operation are selected.

Signal READ, signal SET, signal RESET, signal CNCL, and signal RVREAD shown in FIG. 15 are each control signals that become "H" during the normal data readout operation, the set operation, the reset operation, the cancel operation, and the verify operation at the time of reset. Also, signal bREAD, signal bSET, signal bRESET, and signal bRVREAD are each control signals that become "L" during the normal data readout operation, the set operation, the reset operation, and the verify operation after the reset operation. With this, the circuits C1, C2, C3, and C4 are controlled, and it becomes possible for each operation to be executed individually.

During the normal data readout operation, the power source node VXX is configured to be the voltage Vread/2; the power source node VYY is configured to be the voltage VHR (equal to Vread+set voltage Vα (Vα is, for example, 2-3 V)); the power source node VZZ is configured to be the voltage Vread; the power source node VWW is configured to be the power source voltage VDD; the power source node VAA is configured to be the voltage Vread; and the power source node VIB is configured to be the readout current bias voltage VIR.

During the set operation, the power source node VXX is configured to be the voltage Vs/2; the power source node VYY is configured to be the voltage VHS (equal to Vs+set voltage Vβ (Vβ is, for example, 3-4 V)); the power source node VZZ is configured to be the voltage Vs; the power source node VWW is configured to be the power source voltage VDD; the power source node VAA is configured to be the voltage Vs; and the power source node VIB is configured to be the current limiting bias voltage VIS during the set operation.

During the reset operation, the power source node VXX is configured to be the voltage Vr/2; the power source node VYY is configured to be the voltage VDD; the power source node VZZ is configured to be the ground voltage VSS; the power source node VWW is configured to be the voltage Vr; the power source node VAA is configured to be the voltage Vr; and the power source node VIB is configured to be the ground voltage VSS.

During the cancel operation, the power source node VXX is configured to be the ground voltage VSS; the power source node VYY is configured to be the voltage VHR (equal to Vread +set voltage Vα (Vα is, for example, 2-3 V)); the power source node VZZ is configured to be the voltage Vread; the power source node VWW is configured to be the power source voltage VDD; the power source node VAA is configured to be the ground voltage VSS; and the power source node VIB is configured to be the readout current bias voltage VIR.

During the verify operation, the power source node VXX is configured to be the voltage Vread; the power source node VYY is configured to be the voltage VHR (equal to Vread+set voltage Vα (Vα is, for example, 2-3 V)); the power source node VZZ is configured to be the voltage Vread; the power source node VWW is configured to be the power source voltage VDD; the power source node VAA is configured to be the voltage VHR; and the power source node VIB is configured to be the readout current bias voltage VIR.

During the readout operation and the set operation, the voltage of the selected bit line BL is configured by the amplifier A2 and the transistor N5 for setting the voltage of the feedback-type bit line. Also, the voltage of the unselected bit line BL and the unselected word line WL is configured by the amplifier A1 and the transistor N1 for setting the voltage of the feedback-type unselected wires. The readout operation and the verify operation compare the electrical current that runs through the current mirror circuit, including transistors P5 and P6 (configured by the voltage VIR to the transistor N6), and the electrical current that runs through the selected bit line BL. This is done in the amplifier A3 connected to the selected bit line BL by comparing the size of the voltage of the standard voltage VREF and the drain voltage of the transistor P4 that is determined by the electrical current that runs through the current mirror circuit and the electrical current that the selected memory cell MC applies according to the state. The output signal SAO of the amplifier A3 becomes the result of the readout operation and the verify operation. In the case when the selected memory cell MC is in the set state, the output signal SAO becomes "H," and in the case when the selected memory cell is in the reset state, the output signal SAO becomes "L." With this control circuit, each of the operations can be executed.

Meanwhile, during the set operation, the transistors P5 and P6 connected to the current mirror function as an electrical current limiting circuit that limits the electrical current of the bit line BL to the current that is configured by the voltage VIS to the transistor N6.

Other Examples of Control Circuits

Figure 16:
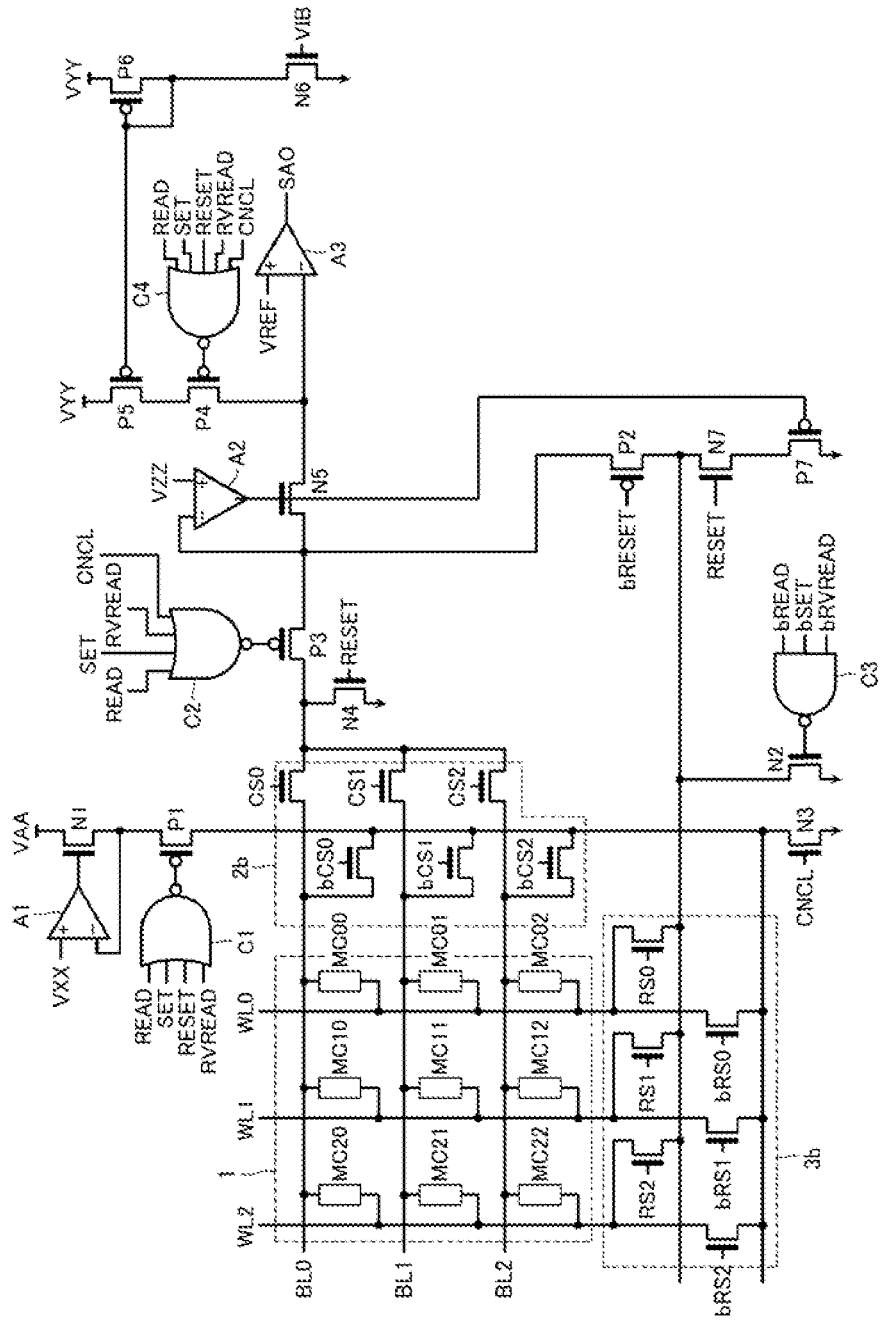
FIG. 16 is a schematic of a circuit used to control the operation of a memory cell of the first embodiment.

Next, other examples of a control circuit for executing the operation of the first embodiment are described with reference to FIG. 16. FIG. 16 is a circuit diagram of the control circuit that controls the operation of the embodiment. The control circuit shown in FIG. 16 differs from the control circuit shown in FIG. 15 in that the control circuit omits the power source node VWW that supplies voltage to the selected word line WL during the reset operation and applies voltage from the power source VZZ to the selected word line WL. Also, the control circuit in FIG. 16 differs from the control circuit shown in FIG. 15 in that the control circuit has a word line discharge circuit including transistors N7 and P7.

During the normal data readout operation, the power source node VXX is configured to be the voltage Vread/2; the power source node VYY is configured to be the voltage VHR (equal to Vread+set voltage Vα (Vα is, for example, 2-3 V)); the power source node VZZ is configured to be the voltage Vread; the power source node VAA is configured to be the voltage Vread; and the power source node VIB is configured to be the readout current bias voltage VIR.

During the set operation, the power source node VXX is configured to be the voltage Vs/2; the power source node VYY is configured to be the voltage VHS (equal to Vs+set voltage Vβ (Vβ is, for example, 3-4 V)); the power source node VZZ is configured to be voltage Vs; the power source node VAA is configured to be the voltage Vs; and the power source node VIB is configured to be the current limiting bias voltage VIS during the set operation.

During the reset operation, the power source node VXX is configured to be the voltage Vr/2; the power source node VYY is configured to be the voltage VHT (equal to Vr+set voltage Vγ (Vγ is, for example, 3-4 V)); the power source node VZZ is configured to be voltage Vr; the power source node VAA is configured to be the voltage Vr; and the power source node VIB is configured to be the limiting current bias voltage VIT during the reset operation.

During the cancel operation, the power source node VXX is configured to be the ground voltage VSS; the power source node VYY is configured to be the voltage VHR (equal to Vread+set voltage Vα (Vα is, for example, 2-3 V)); the power source node VZZ is configured to be voltage Vread; the power source node VAA is configured to be ground voltage VSS; and the power source node VIB is configured to be the readout current bias voltage VIR.

During the verify operation, the power source node VXX is configured to be the voltage Vread; the power source node VYY is configured to be the voltage VHR (equal to Vread+set voltage Vα (Vα is, for example, 2-3 V)); the power source node VZZ is configured to be voltage Vread; the power source node VAA is configured to be the ground voltage VHR; and the power source node VIB is configured to be the readout current bias voltage VIR.

Using the control circuit shown in FIG. 16, each of the operations discussed above can be executed. Meanwhile, in the case when the selected memory cell MC changes to the reset state during the reset operation, the word line WL is discharged by the transistors N7 and P7. This discharging prevents the selected memory cell from destruction by high electric field applied to the selected memory cell MC in the reset state.

Second Embodiment

Next, the second embodiment of the present invention is described with reference to FIG. 18. The overall composition of the semiconductor storage device of the present embodiment is the same as that of the first embodiment, and the detailed description is omitted below. Also, parts that have the same configuration as the first embodiment will be given the same reference notations, and the redundant descriptions will be omitted. The first embodiment has been described as executing a cancel operation 2 and a verify operation after executing a cancel operation 1. The second embodiment differs from the first embodiment in that the cancel operation 2 and the verify operation are executed before the cancel operation 1.

Figure 18:
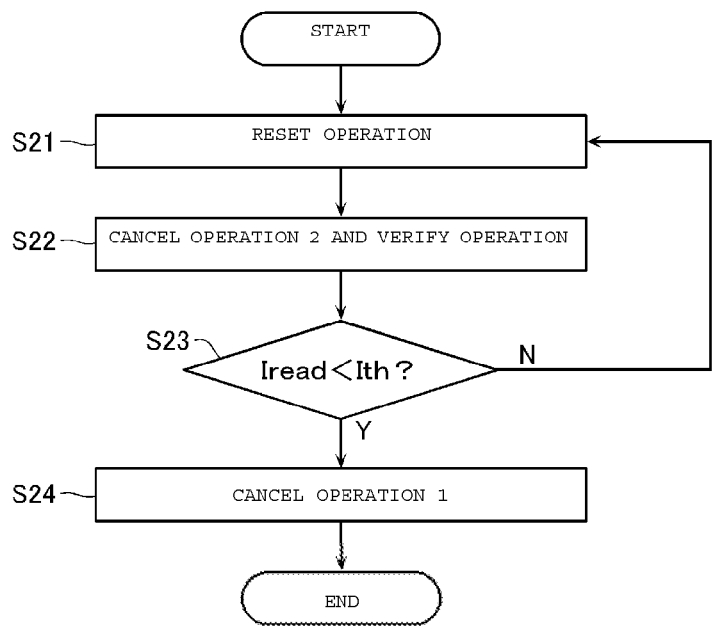
FIG. 18 is a flow chart that illustrates a process of using a memory cell of a second embodiment.

FIG. 18 is a flow chart that explains the operation of the present embodiment. In the present embodiment, the voltage application state during the reset operation, the cancel operation, and the verify operation is the same as the first embodiment, so the description is omitted.

When the reset operation, the cancel operation, and the verify operation of the present embodiment are started, the reset operation is executed in step S21. At this time, the voltage application state of the memory cell array 1 is in the reset operation state shown in FIG. 12. Next, the cancel operation 2 and the verify operation are executed in step S22. At this time, the voltage application state of the memory cell array 1 is in the cancel operation 2 and the verify operation state shown in FIG. 12.

In step S23, the electric current Iread that passes through the bit line BL0 via the selected memory cell MC20 during the verify operation and the acceptance value Ith are compared. If the electric current Iread is less than the acceptance value Ith, a determination is made that the selected memory cell MC20 has changed to the reset state, and the operation moves on to the next step S24. Meanwhile, if the electric current Iread is greater than or equal to the acceptance value Ith, a determination is made that the selected memory cell MC20 is in the set state, and the reset operation of the step S21 is executed again.

The cancel operation 1 is also executed in step S24. At this time, the voltage application state of the memory cell array 1 is in the cancel operation 1 state shown in FIG. 12. In the semiconductor storage device of the present embodiment, after executing the cancel operation 1 of step S24 once, the operation ends.

Effects

In the semiconductor storage device according to the present embodiment, a reset operation, a cancel operation, and a verify operation are carried out. Due to the voltage application during the cancel operation, the disturbance of the variable resistance element VR of the half-selected memory cells MC is resolved. Also, the cancel operation of the half-selected memory cells MC and the verify operation of the selected memory cell MC are carried out at the same time. For this reason, even when executing the verify operation on the memory cell array 1 after the reset operation, operating time is not required to complete the verify operation, so the operating time of the semiconductor storage device can be decreased. Additionally, in the semiconductor storage device of the present embodiment, it is possible to arbitrarily change the order of the cancel operation 1, the cancel operation 2, and the verify operation. The time constraints relating to when the operation of the semiconductor storage device can be performed are decreased, and it becomes possible to easily execute the semiconductor storage device control operations.

Third Embodiment

Next, the third embodiment of the present invention is described with reference to FIG. 19. The overall composition of the semiconductor storage device of the present embodiment is the same as that of the first embodiment, and the detailed description is omitted below. Also, parts that have the same configuration as the first embodiment will be given the same reference notations, and the redundant descriptions will be omitted. The second embodiment has been described as executing a cancel operation 1 after the cancel operation 2 and the verify operation once. The third embodiment differs from the second embodiment in that the number of times of the cancel operation 1 that is executed after the cancel operation 2 and the verify operation is controlled.

Figure 19:
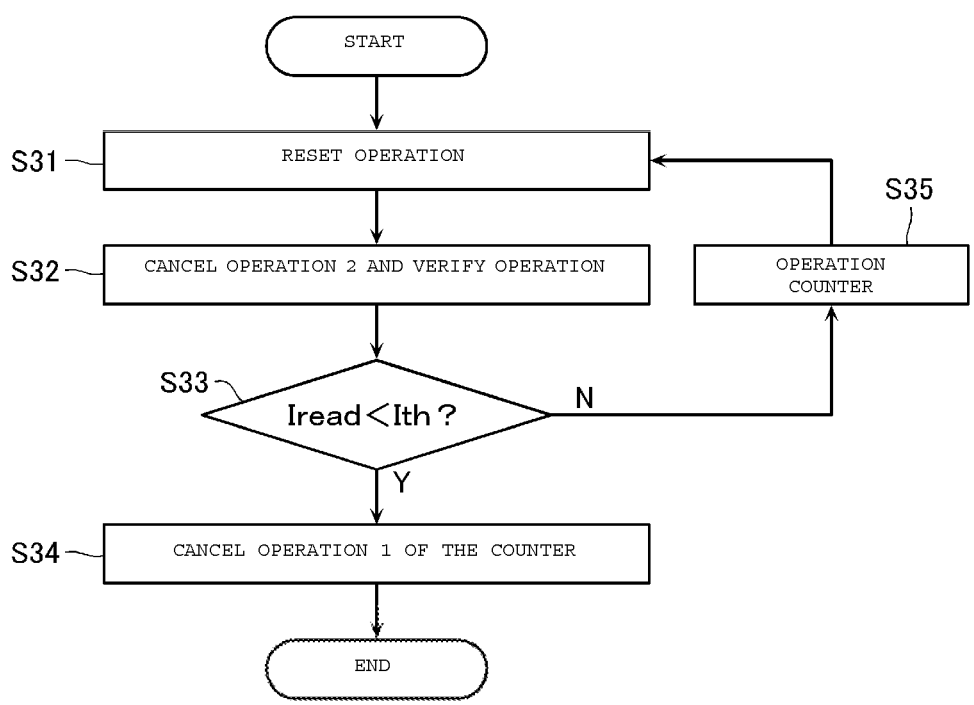
FIG. 19 is a flow chart that illustrates a process of using a memory cell of a third embodiment.

FIG. 19 is a flow chart that explains the operation of the present embodiment. In the present embodiment, the voltage application state during the reset operation, the cancel operation, and the verify operation is the same as that of the first embodiment, so the description is omitted.

When the reset operation, the cancel operation, and the verify operation of the present embodiment are started, the reset operation is executed in step S31. At this time, the voltage application state of the memory cell array 1 is in the reset operation state shown in FIG. 12. Next, the cancel operation 2 and the verify operation are executed in step S32. At this time, the voltage application state of the memory cell array 1 is in the cancel operation 2 and the verify operation state shown in FIG. 12.

In step S33, the electric current Iread that passes through the bit line BL0 via the selected memory cell MC20 during the verify operation and the acceptance value Ith are compared. If the electric current Iread is less than the acceptance value Ith, a determination is made that the selected memory cell MC20 has changed to the reset state, and the operation moves on to the next step S34. Meanwhile, if the electric current Iread is greater than or equal to the acceptance value Ith, a determination is made that the selected memory cell MC20 is in the set state, and the reset operation of the step S31 is executed again. At this time, in step S35, the number of times that the cancel operation 2 and the verify operation are executed is counted. The results of this count are retained in the memory, etc., installed in the control circuit.

After successfully completing step S33, in step S34, the cancel operation 1 is executed. At this time, the voltage application state of the memory cell array 1 is in the cancel operation 1 state shown in FIG. 12. In the present embodiment, the cancel operation 1 of step S34 is repeated the same number of times that the cancel operation 2 and the verify operation of step S32 have been executed. This is executed by referring to a counter in the memory, etc., installed on the control circuit.

Effects

In the semiconductor storage device according to the present embodiment, a reset operation, a cancel operation, and a verify operation are carried out. Due to the voltage application during the cancel operation(s), the disturbance of the variable resistance element VR of the half-selected memory cells MC is resolved. Also, the cancel operation of the half-selected memory cells MC and the verify operation of the selected memory cell MC are carried out at the same time. For this reason, even when executing the verify operation on the memory cell array 1 after the reset operation, operating time is not required to complete the verify operation, so the operating time of the semiconductor storage device can be decreased.

Also, in the semiconductor storage device of the present embodiment, control is implemented so that the number of times the cancel operation 1 is executed and the number of times the cancel operation 2 and verify operations are executed are equal. During the cancel operation 1 and the cancel operation 2, the cancel voltage is applied to different half-selected memory cells MC. When the number of times that the cancel operation 1 and the cancel operation 2 are executed differs, there is the possibility that the state that different half-selected memory cells MC will be in after a different number of cancel voltages have been applied will differ. However, like the present embodiment, by making the number of times of the cancel operation 1 is executed and the number of times of the cancel operation 2 and the verify operation are executed equal, the states of the half-selected memory cells MC after the cancel operations can be made the same.

While the cancel operation 1 is described as repeating the same number of times as the cancel operation 2 and the verify operation, the same effect can be achieved by extending the cancel voltage application time Tcancel for a single cancel operation 1. In one example, by applying a single cancel voltage Vcancel that has a cancel voltage application time Tcancel multiplied by the difference in the number of times the cancel operation 2 and the verify operation and the cancel operation 1 are executed, the same effect can be obtained as when repeating the cancel operation 1 the same number of times.

Fourth Embodiment

Next, the fourth embodiment of the present invention is described with reference to FIG. 20. The overall composition of the semiconductor storage device of the present embodiment is the same as that of the first embodiment, and the detailed description is omitted. Also, parts that have the same configuration as the first embodiment will be given the same reference notations, and the redundant descriptions will be omitted. In the fourth embodiment, the control of the voltage that is applied to the bit line BL and the word line WL during the cancel operation differs from that of the first and the second embodiments.

Cancel Operation

The cancel operation in the present embodiment is also an operation wherein a cancel voltage of a positive polarity is applied to the half-selected memory cells MC after the reset operation, and the disturbance of the variable resistance element VR is resolved. In one embodiment, control is carried out so that the voltages of the unselected bit lines BL1 and BL2, as well as of the unselected word lines WL0 and WL1, do not change during the reset operation, during the cancel operation and during verify operation, respectively. The cancel operation and the verify operation of the present embodiment are described below.

Figure 20:
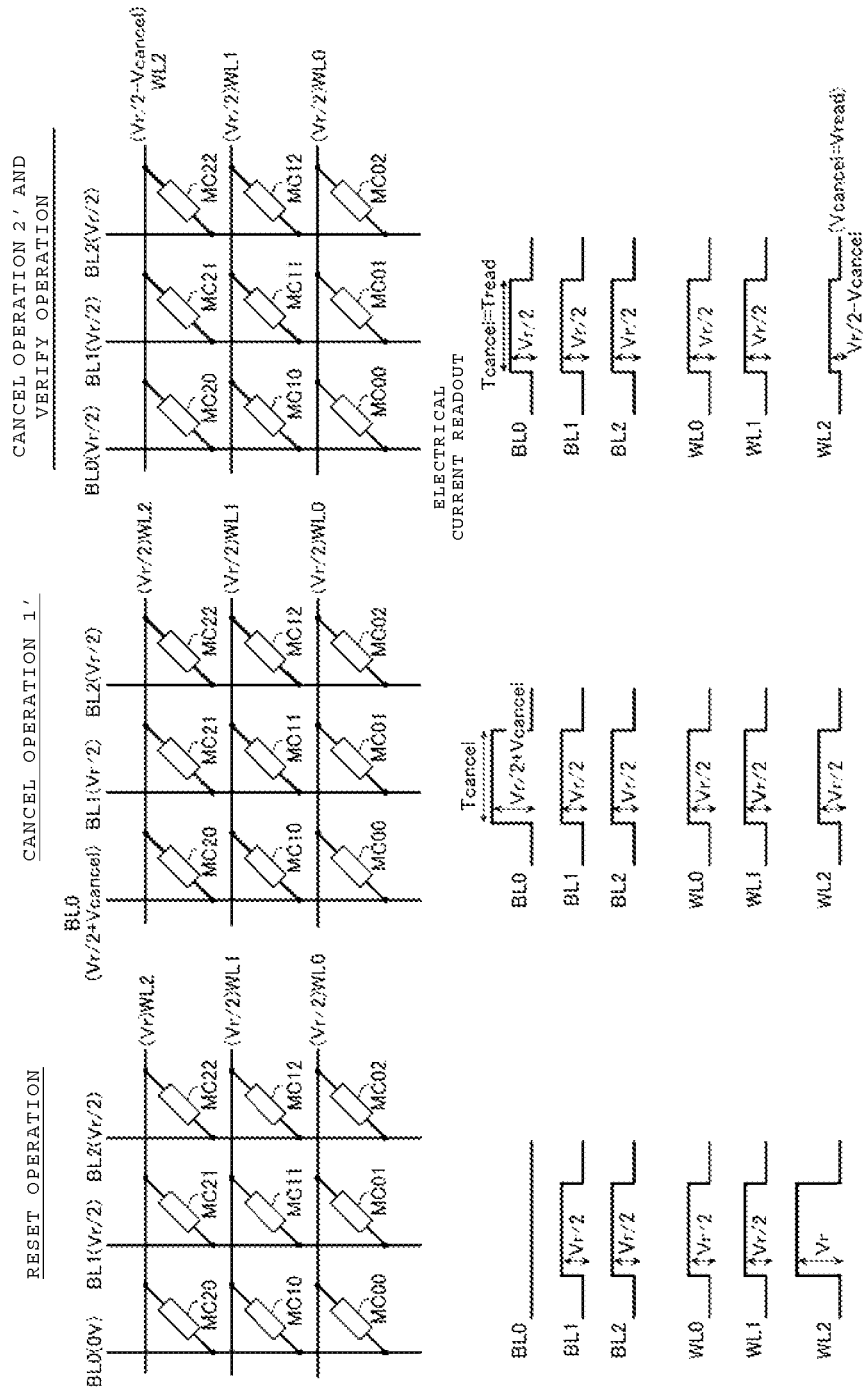
FIG. 20 is a diagram that illustrates the voltage application state during a reset operation, a cancel operation, and a verify operation of a fourth embodiment.

FIG. 20 is a diagram that shows the voltage application state during the reset operation, the cancel operation, and the verify operation of the present embodiment. The cancel operation and the verify operation of the present embodiment carry out the operations shown in FIG. 20 in sequence.

Since the voltage application state during the reset operation shown in FIG. 20 is the same as the reset voltage application state shown in FIG. 12, the description is omitted.

In the cancel operation of the present embodiment, first, a cancel operation 1' is executed on the half-selected memory cells MC10 and MC00 to resolve the disturbance of the variable resistance element VR. Then, a cancel operation 2' is executed on the half-selected memory cells MC21 and MC22 to resolve the disturbance of the variable resistance element VR. This order may be changed arbitrarily.

As shown in FIG. 20, in the cancel operation 1', a voltage Vr/2+Vcancel is applied to the bit line BL0. A voltage Vr/2 is applied to the bit lines BL1 and BL2, as well as to the word lines WL0, WL1, and WL2. The application time of this voltage is the cancel voltage application time Tcancel.

Also, as shown in FIG. 20, in the cancel operation 2', a voltage Vr/2 is applied to the bit lines BL0, BL1, and BL2. A voltage Vr/2−Vcancel is applied to the word line WL2. Also, the cancel voltage Vr/2 is applied to the word lines WL0 and WL1. The application time of this voltage is the cancel voltage application time Tcancel.

Even when a cancel operation as shown in FIG. 20 is executed, a cancel voltage Vcancel of a positive polarity that is necessary for the cancel operation is applied to the half-selected memory cells MC. The waveform diagram of the voltage that is applied to the memory cell MC during the reset operation and the cancel operation(s) of the present embodiment becomes the same as that shown in FIG. 13. With this, the disturbance of the variable resistance element VR of the half-selected memory cells MC is resolved. That is, the conduction voltage of the variable resistance element VR is lowered to a value that is around the normal conduction voltage achieved when a conduction voltage equal to Vth_s is applied to the half-selected memory cells MC.

At the time of the cancel operation 2', a cancel voltage Vcancel of a positive polarity is applied to the selected memory cell MC20. This cancel voltage Vcancel can be configured to be the same value as the voltage Vread. The voltage Vread is a voltage that can determine if the selected memory cell MC20 is in the set state or in the reset state. In the semiconductor storage device of the present embodiment, the cancel operation 2' and the verify operation are executed at the same time. In this case, the cancel voltage application time Tcancel is equivalent to the readout voltage application time Tread.

Meanwhile, voltage is not applied to the half-selected memory cells MC10 and MC00 that are connected to the bit line BL0 that reads out the electric current value during this verify operation. For this reason, an electric current is not passed through the bit line BL via the half-selected memory cells MC10 and MC00, and the state of the selected memory cell MC20 can be accurately read.

Effects

In the semiconductor storage device according to the present embodiment, a reset operation, a cancel operation, and a verify operation are carried out. Due to the voltage application during the cancel operation, the disturbance of the variable resistance element VR of the half-selected memory cells MC is resolved. Also, the cancel operation of the half-selected memory cells MC and the verify operation of the selected memory cell MC are carried out at the same time. Consequently, even when executing the verify operation on the memory cell array 1 after the reset operation, operating time is not required to complete the verify operation, so the required operating time of the semiconductor storage device can be decreased.

In the semiconductor storage device according to the present embodiment, the bit lines BL1 and BL2, as well as the word lines WL0 and WL1 that are unselected during the reset operation, are fixed at the same voltage Vr/2 during both the reset operation and the cancel operation. In a large-scale memory cell array 1, the numbers of unselected bit lines BL and unselected word lines WL become extremely large. By fixing the voltage of the unselected bit lines BL and the unselected word lines WL across the entirety of the reset operation and the cancel operation, control of the voltage necessary for operation becomes easy.

Control Circuit of Fourth Embodiment

Figure 21:
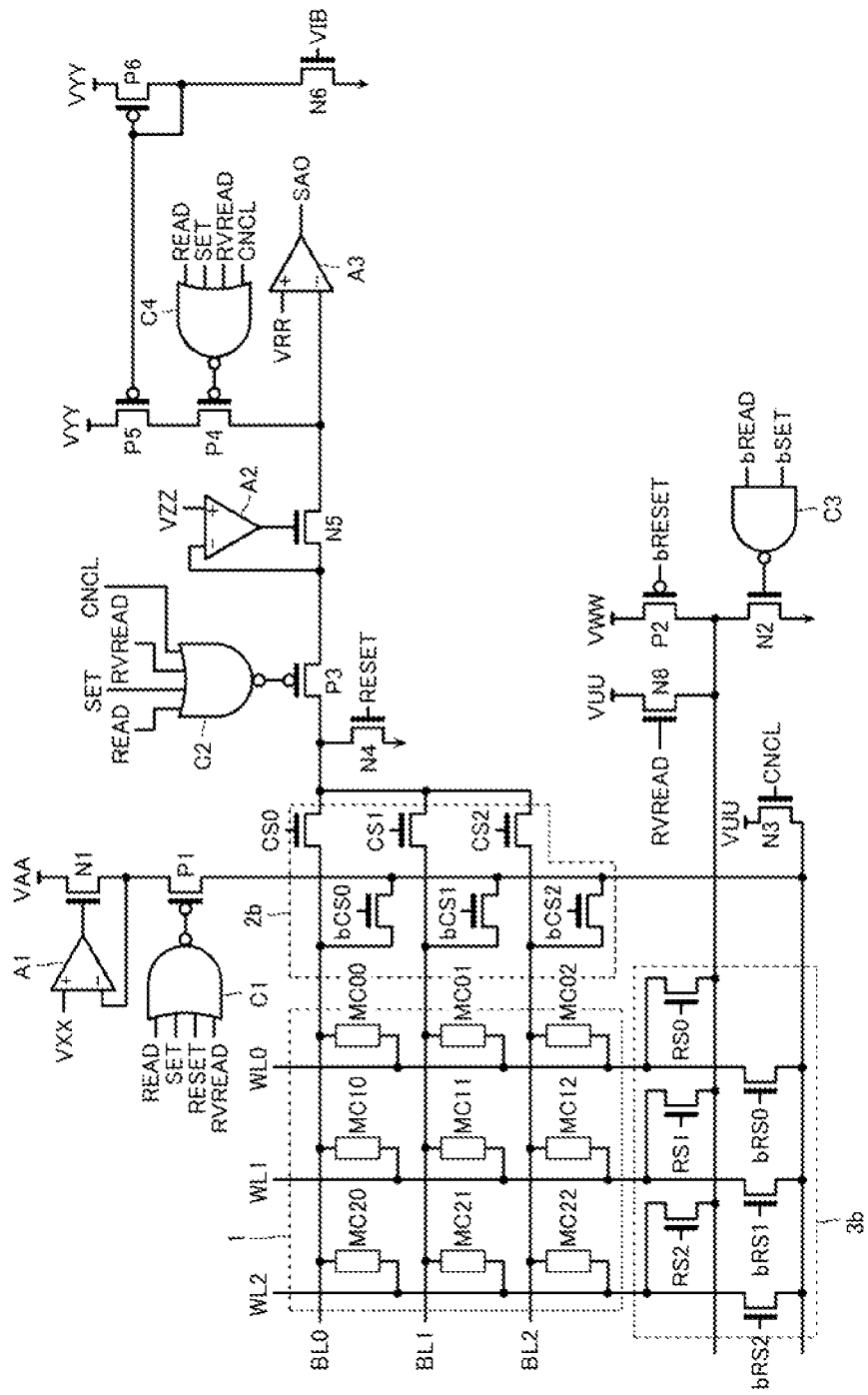
FIG. 21 is a schematic of a circuit used to control the operation of a memory cell of the fourth embodiment.

Next, the control circuit for executing the operation of the fourth embodiment is described with reference to FIG. 21. FIG. 21 is a circuit diagram of the control circuit that controls the operation of the embodiment. The control circuit shown in FIG. 21 differs from the control circuit shown in FIG. 15 in that the control circuit installs a power source node VUU that supplies voltage to the selected word line WL during the verify operation.

During the normal data readout operation, the power source node VXX is configured to be the voltage Vread/2; the power source node VYY is configured to be the voltage VHR (equal to Vread+set voltage V$\alpha$ (V$\alpha$ is, for example, 2-3 V)); the power source node VZZ is configured to be the voltage Vread; the power source node VWW is configured to be the power source voltage VDD; the power source node VUU is configured to be the ground voltage VSS; the power source node VAA is configured to be the voltage Vread; the power source node VRR is configured to be the reference voltage VREF; and the power source node VIB is configured to be the readout current bias voltage VIR.

During the set operation, the power source node VXX is configured to be the voltage Vs/2; the power source node VYY is configured to be the voltage VHS (equal to Vs+set voltage V$\beta$ (V$\beta$ is, for example, 3-4 V)); the power source node VZZ is configured to be voltage Vs; the power source node VWW is configured to be the power source voltage VDD; the power source node VUU is configured to be the ground voltage VSS; the power source node VAA is configured to be the voltage Vs; the power source node VRR is configured to be the ground voltage VSS; and the power source node VIB is configured to be the current limiting bias voltage VIS during the set operation.

During the reset operation, the power source node VXX is configured to be the voltage Vr/2; the power source node VYY is configured to be the power source voltage VDD; the power source node VZZ is configured to be the ground voltage VSS; the power source node VWW is configured to be the voltage Vr; the power source node VUU is configured to be the ground voltage VSS; the power source node VAA is configured to be the voltage Vr; the power source node VRR is configured to be the ground voltage VSS; and the power source node VIB is configured to be the ground voltage VSS.

During the cancel operation, the power source node VXX is configured to be the voltage Vr/2; the power source node VYY is configured to be the voltage VHC (equal to Vread+Vr/2+set voltage V$\gamma$ (V$\gamma$ is, for example, 3-4 V)); the power source node VZZ is configured to be the voltage Vr/2+Vread; the power source node VWW is configured to be the voltage Vr/2; the power source node VUU is configured to be the voltage Vr/2; the power source node VAA is configured to be the voltage Vr; the power source node VRR is configured to be the ground voltage VSS; and the power source node VIB is configured to be the readout current bias voltage VIR.

During the verify operation, the power source node VXX is configured to be the voltage Vr/2; the power source node VYY is configured to be the voltage Vr; the power source node VZZ is configured to be voltage Vr/2; the power source node VWW is configured to be the voltage Vr/2; the power source node VUU is configured to be the voltage Vr/2−Vread; the power source node VAA is configured to be the voltage Vr; the power source node VRR is configured to be the comparative voltage VREF_RV of the amplifier A3 for the verify operation; and the power source node VIB is configured to be the readout current bias voltage VIR.

With the control of this control circuit and the power source node, the cancel operation 1', the cancel operation 2' and the verify operation can be executed.

Fifth Embodiment

The fifth embodiment of the present invention is described with reference to FIGS. 22 to 25. The overall composition of the semiconductor storage device of the present embodiment is the same as that of the first embodiment, and the detailed description is omitted. Also, parts that have the same configuration as the first embodiment will be given the same reference notations, and the redundant descriptions will be omitted. In the fifth embodiment, the cancel operation includes applying a weak negative polarity voltage after applying a cancel voltage Vcancel having a positive polarity.

Operation of the Present Embodiment

The set operation of the present embodiment applies a set voltage Vs of a positive polarity that can connect the conductive filament F to the electrode EL1 to the variable resistance element VR in the reset state. After that, a negative polarity voltage is applied to partially disconnect the conductive filament F, and the set state shown in FIG. 5 is formed.

In the cancel operation of the present embodiment, like this set operation, a cancel voltage Vcancel of a positive polarity, which can connect the conductive filament F to the electrode EL1, is applied to the variable resistance element VR that has received a disturbance. After that, a negative polarity voltage is applied to at least partially disconnect the conductive filament F. Below, the cancel operation and the negative voltage applied operation according to the present embodiment are described with reference to FIGS. 22 to 25.

Figure 22:
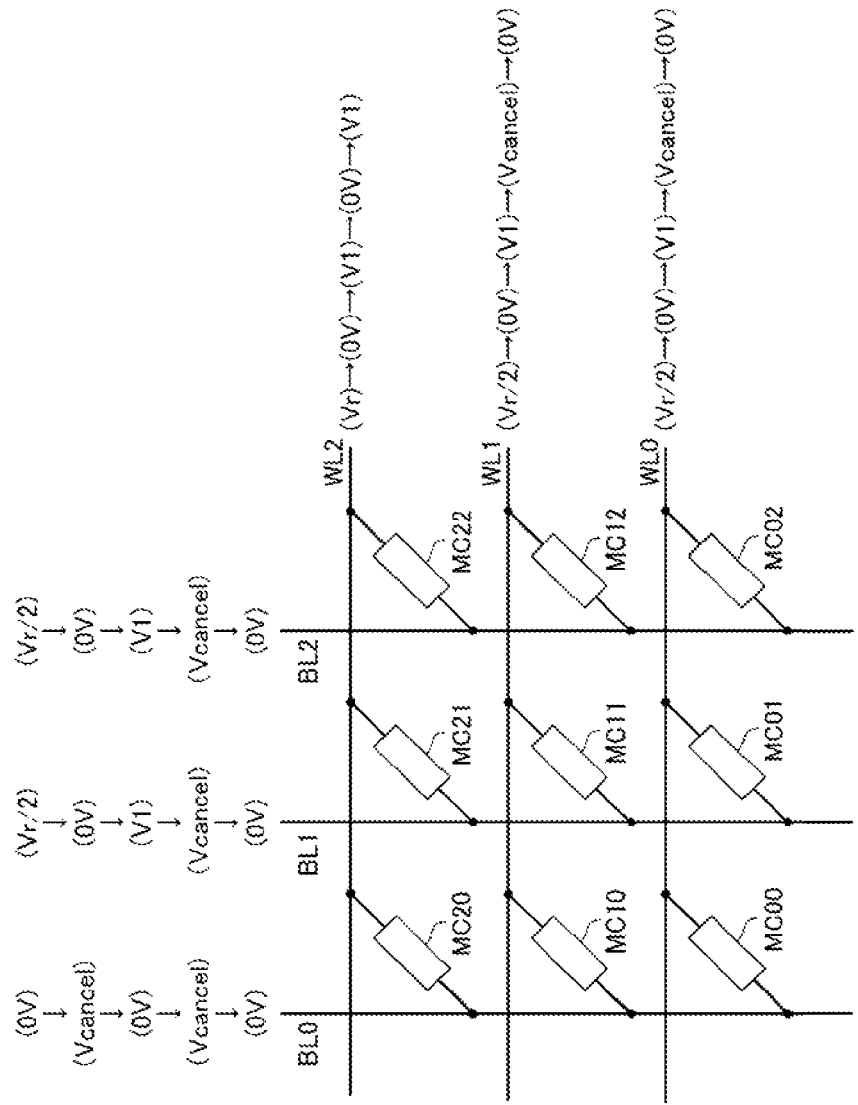
FIG. 22 is a diagram that illustrates the voltage application state(s) during a reset operation, a cancel operation, a verify operation, and a negative voltage application operation of a fifth embodiment.
Figure 23:
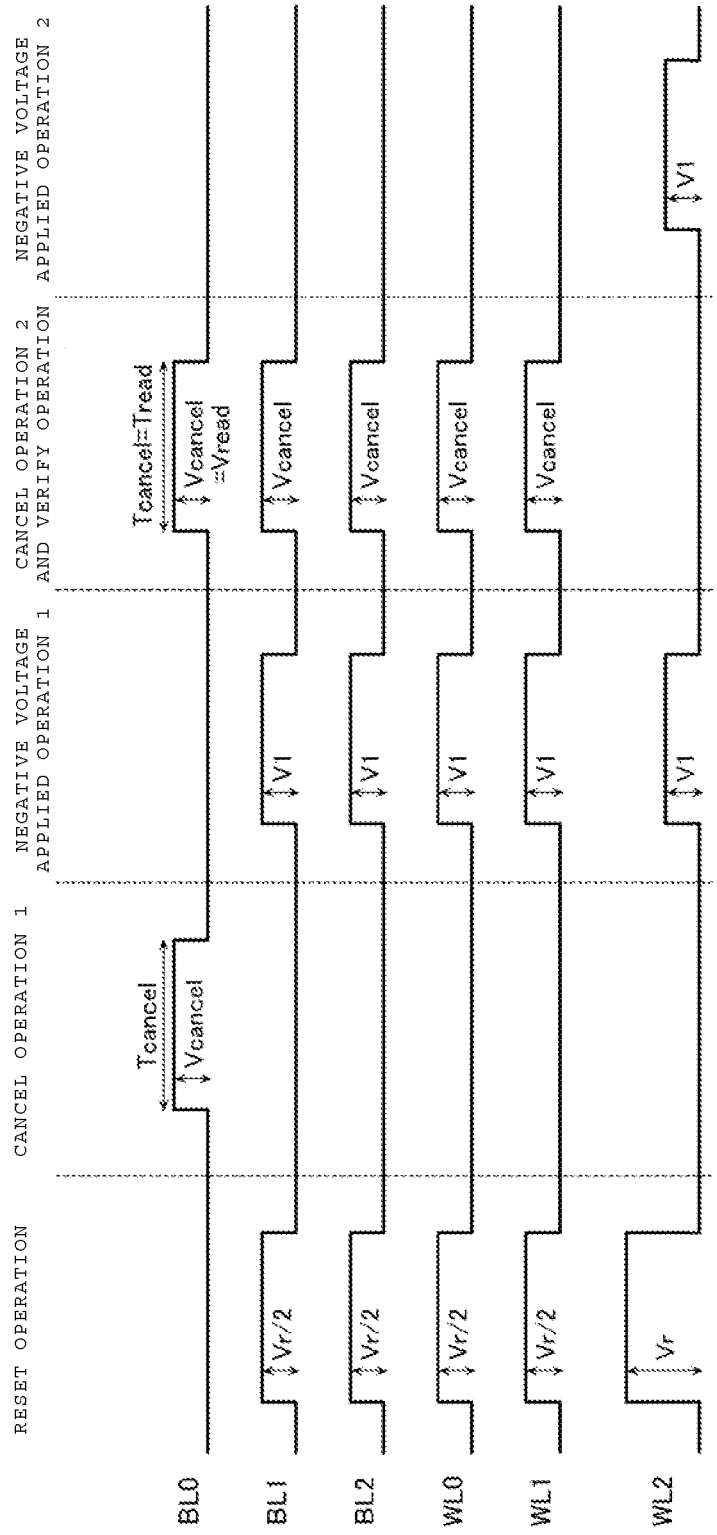
FIG. 23 is a diagram that illustrates the voltage application state(s) during a reset operation, a cancel operation, a verify operation, and a negative voltage application operation of the fifth embodiment.
Figure 24:
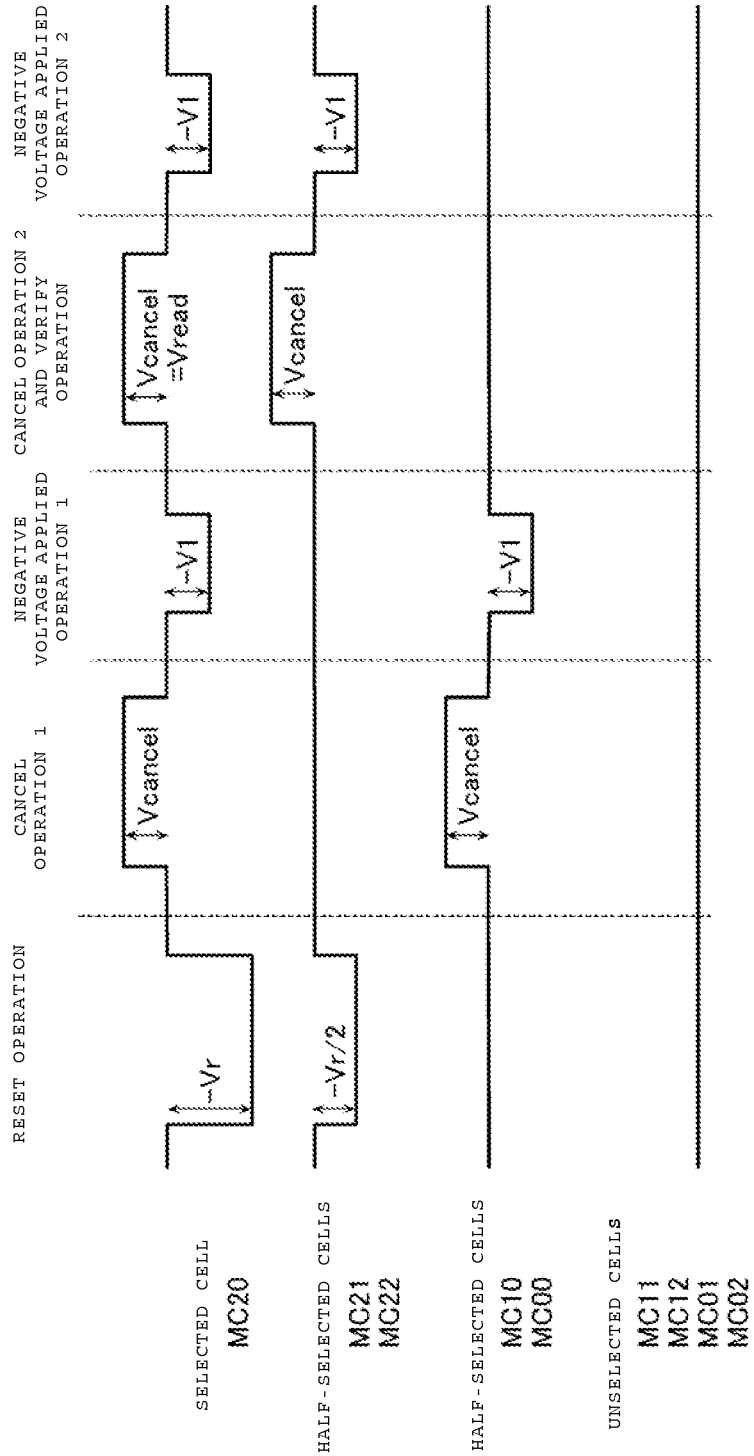
FIG. 24 is a voltage waveform diagram illustrating voltages applied during a reset operation, a cancel operation, a verify operation, and a negative voltage application operation of the fifth embodiment.

FIGS. 22 and 23 are diagrams that show the voltage application state during the negative voltage applied operation of the present embodiment. The negative voltage applied operation of the present embodiment is carried out after each of the cancel operations 1 and 2 shown in FIG. 13. The present embodiment describes an example of executing the cancel operation on the half-selected memory cells MC21, MC22, MC10, and MC00, wherein the memory cell MC20 that is connected to the selected bit line BL0 and selected word line WL2 is considered the selected memory cell MC and the reset operation is executed.

Since the voltage application state during the reset operation and the cancel operation is the same as the reset voltage application state shown in FIG. 12, the description is omitted.

In the present embodiment, after executing the cancel operation 2 on the half-selected memory cells MC10 and MC00, a negative voltage applied operation 1 is conducted on the half-selected memory cells MC10 and MC00. Also, after executing the cancel operation 2 on the half-selected memory cells MC21 and MC22, a negative voltage applied operation 2 is conducted on the half-selected memory cells MC21 and MC22.

As shown in FIGS. 22 and 23, in the negative voltage applied operation 1, a weak reset voltage V1 is applied to the bit lines BL1 and BL2, as well as to the word lines WL0, WL1, and WL2. The electric potential of the bit line BL0 shall be 0 V. With the voltage application during the negative voltage applied operation 1, a weak reset voltage V1 of a negative polarity is applied to the half-selected memory cells MC10 and MC00 (refer to FIG. 24). With this, in the half-selected memory cells MC10 and MC00, part of the conductive filament F that is connected to the electrode EL1 is disconnected by the application of the weak reset voltage V1 in the negative voltage applied operation 1. That is, the variable resistance element VR can be changed to a set state similar to the one shown in FIG. 5.

Also, as shown in FIGS. 22 and 23, in the negative voltage applied operation 1, a weak reset voltage V1 is applied to the word line WL2. The electric potential of the bit lines BL0, BL1, and BL2, as well as the word lines WL0 and WL1, shall be 0 V. With the voltage application during the negative voltage applied operation 2, a weak reset voltage V1 of a negative polarity is applied to the half-selected memory cells MC21 and MC22 (refer to FIG. 24). With this, in the half-selected memory cells MC21 and MC22, part of the conductive filament F that is connected to the electrode EL1 is disconnected by the application of the weak reset voltage V1 in the negative voltage applied operation 2. That is, the variable resistance element VR can be changed to a set state similar to the one shown in FIG. 5.

Here, at the time of the negative voltage applied operation 1 and negative voltage applied operation 2, a weak reset voltage V1 of a negative polarity is applied to the selected memory cell MC20. However, even though a reset operation has been carried out on the selected memory cell MC20, the application of the weak reset voltage(s) V1 should have no adverse effect on the selected memory cell MC20. Also, since voltage is not applied to the half-selected memory cells MC10 and MC00 or to the unselected memory cells MC11, MC12, MC01, and MC02, these memory cells MC will be maintained in the same state as prior to the negative voltage applied operations.

Meanwhile, the weak reset voltage V1 that is applied to the half-selected memory cells MC must be one that maintains the half-selected memory cells MC in the set state. For this reason, at least either the value of the weak reset voltage V1 is configured to be smaller than the value of the reset voltage Vr that is applied to the selected memory cell MC during the reset operation or the voltage application time is smaller than the reset voltage application time applied during the reset operation.

Figure 25:
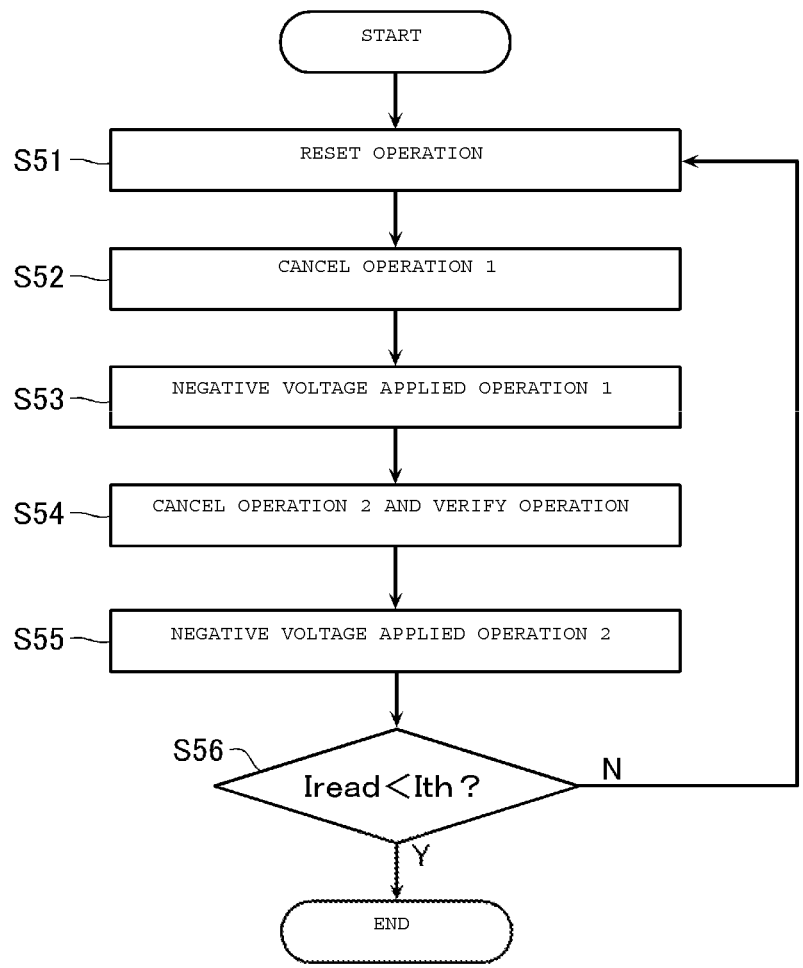
FIG. 25 is a flow chart that illustrates a process of using a memory cell of the fifth embodiment.

FIG. 25 is a flow chart that illustrates the operation of the present embodiment. When the reset operation, the cancel operation, the verify operation and the negative voltage applied operation of the present embodiment are started, the reset operation is executed in step S51. At this time, the voltage application state of the memory cell array 1 is in the reset state shown in FIGS. 22 and 23. Next, the cancel operation 1 is executed in step S52. At this time, the voltage application state of the memory cell array 1 is in the cancel operation 1 state shown in FIGS. 22 and 23. Next, the negative voltage applied operation is executed to the half-selected memory cells MC in step S53. At this time, the voltage application state of the memory cell array 1 is in the negative voltage applied operation state shown in FIGS. 22 and 23.

Then, the cancel operation 2 and the verify operation are executed in step S54. At this time, the voltage application state of the memory cell array 1 is in the cancel operation 2 and the verify operation state shown in FIGS. 22 and 23. Next, the negative voltage applied operation is executed on the half-selected memory cells MC in step S55. At this time, the voltage application state of the memory cell array 1 is in the negative voltage applied operation state shown in FIGS. 22 and 23.

In step S56, the electric current Iread that passes through the bit line BL0 via the selected memory cell MC20 during the verify operation and the acceptance value Ith are compared. If the electric current Iread is greater than or equal to the acceptance value Ith, a determination is made that the selected memory cell MC20 is in the set state, and the reset operation of step S51 is executed again. On the other hand, if the electric current Iread is less than the acceptance value Ith, a determination is made that the selected memory cell MC20 has changed to the reset state, and the operation is ended.

Effects

In the semiconductor storage device according to the present embodiment, a reset operation, a cancel operation, and a verify operation are carried out. Due to the voltage application during the cancel operation, the disturbance of the variable resistance element VR of the half-selected memory cells MC is resolved. Also, the cancel operation of the half-selected memory cells MC and the verify operation of the selected memory cell MC are carried out at the same time. For this reason, even when executing the verify operation on the memory cell array 1 after the reset operation, operating time is not required to complete the verify operation, so the operating time of the semiconductor storage device can be decreased.

In the semiconductor storage device according to the present embodiment, a negative voltage applied operation is executed on the half-selected memory cells MC after the cancel operation. With this, the half-selected memory cells MC after the cancel operation can be reliably configured to the desired set state.

Control Circuit of Fifth Embodiment

Figure 26:
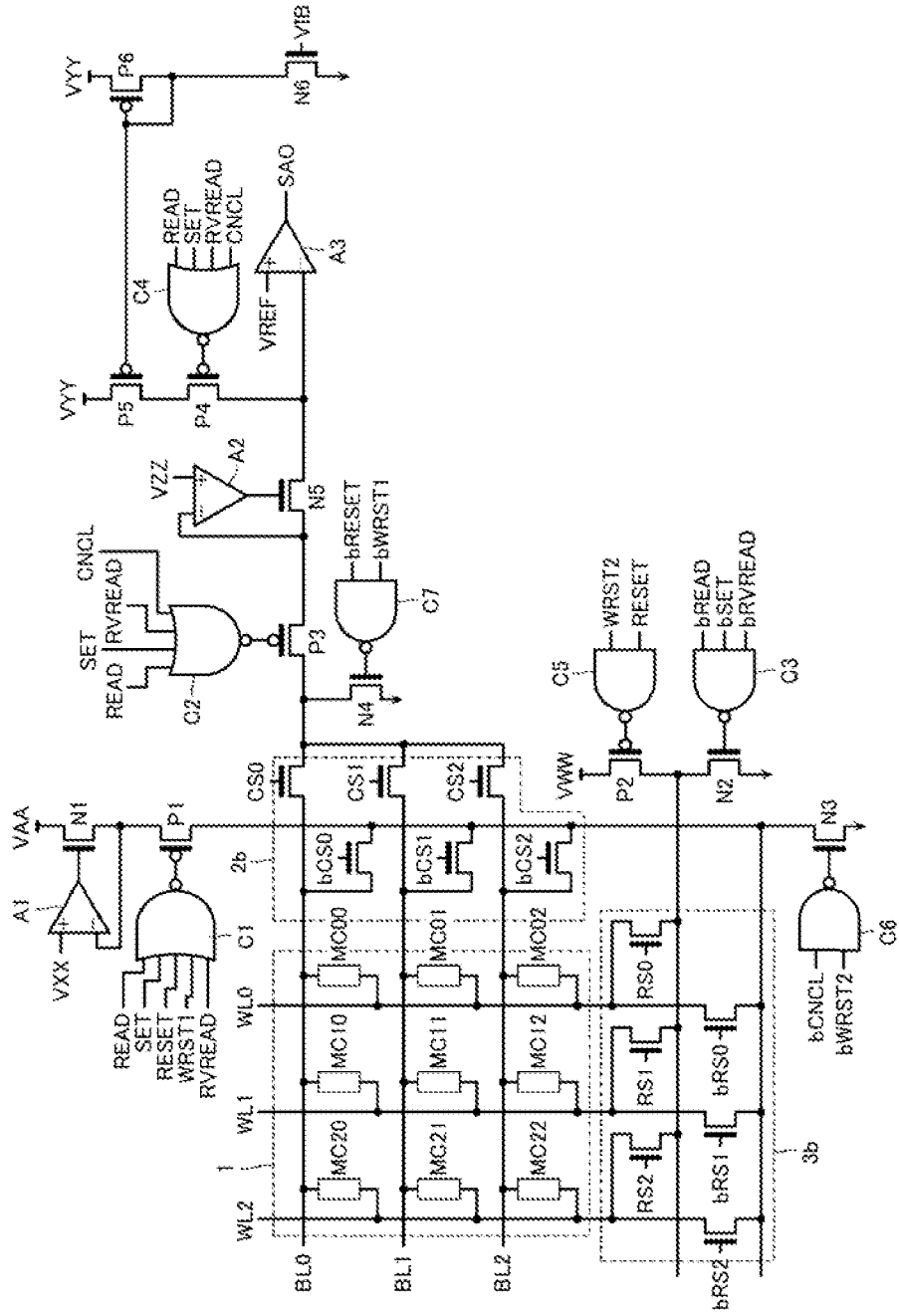
FIG. 26 is a schematic of a circuit used to control the operation of a memory cell of the fifth embodiment.

The control circuit for executing the operation of the fifth embodiment is described with reference to FIG. 26. FIG. 26 is a circuit diagram of the control circuit that controls the operation of the embodiment. The control circuit shown in FIG. 26 differs from the control circuit shown in FIG. 15 in that the control circuit installs circuits C5, C6, and C7 to execute the control of the negative voltage applied operation.

Signal WRST1 and signal WRST2 shown in FIG. 26 are each control signals that become "H" during the negative voltage applied operation 1 and the negative voltage applied operation 2. Also, signal bWRST1 and signal bWRST2 are each control signals that become "L" during the negative voltage applied operation 1 and the negative voltage applied operation 2.

During the normal data readout operation, the power source node VXX is configured to be the voltage Vread/2; the power source node VYY is configured to be the voltage VHR (equal to Vread+set voltage Vα (Vα is, for example, 2-3 V)); the power source node VZZ is configured to be voltage Vread; the power source node VWW is configured to be the power source voltage VDD; the power source node VAA is configured to be the voltage Vread; and the power source node VIB is configured to be the readout current bias voltage VIR.

During the set operation, the power source node VXX is configured to be the voltage Vs/2; the power source node VYY is configured to be the voltage VHS (equal to Vs+set voltage Vβ (Vβ is, for example, 3-4 V)); the power source node VZZ is configured to be voltage Vs; the power source node VWW is configured to be the power source voltage VDD; the power source node VAA is configured to be the voltage Vs; and the power source node VIB is configured to be the current limiting bias voltage VIS at the set operation.

During the reset operation, the power source node VXX is configured to be the voltage Vr/2; the power source node VYY is configured to be the power source voltage VDD; power source node VZZ is configured to be the ground voltage VSS; the power source node VWW to be the voltage Vr, the power source node VAA is configured to be the voltage Vr; and the power source node VIB is configured to be ground voltage VSS.

During the cancel operation, the power source node VXX is configured to be the ground voltage VSS; the power source node VYY is configured to be the voltage VHR; the power source node VZZ is configured to be the voltage Vread; the power source node VWW is configured to be the power source voltage VDD; the power source node VAA is configured to be ground voltage VSS; and the power source node VIB is configured to be the readout current bias voltage VIR.

During the verify operation, the power source node VXX is configured to be the voltage Vread; the power source node VYY is configured to be the voltage VHR; the power source node VZZ is configured to be the voltage Vread; the power source node VWW is configured to be the power source voltage VDD; the power source node VAA is configured to be the voltage VHR; and the power source node VIB is configured to be the readout current bias voltage VIR.

During the negative voltage applied operation 1, the power source node VXX is configured to be the voltage V1; the power source node VYY is configured to be the power source voltage VDD; the power source node VZZ is configured to be ground voltage VSS; the power source node VWW is configured to be the power source voltage VDD; the power source node VAA is configured to be the voltage VHR; and the power source node VIB is configured to be the ground voltage VSS. During the negative voltage applied operation 2, the power source node VXX is configured to be the ground voltage VSS; the power source node VYY is configured to be the power source voltage VDD; the power source node VZZ is configured to be the ground voltage VSS; the power source node VWW is configured to be the voltage V1; the power source node VAA is configured to be the ground voltage VSS; and the power source node VIB is configured to be the ground voltage VSS.

With the control of this control circuit and the power source node, the negative voltage applied operation 1 and the negative voltage applied operation 2 can be executed.

Sixth Embodiment

The sixth embodiment of the present invention is described with reference to FIGS. 27 and 28. The overall composition of the semiconductor storage device of the present embodiment is the same as that of the first embodiment, and the detailed description is omitted. Also, parts that have the same configuration as the first embodiment will be given the same reference notations, and the redundant descriptions will be omitted. With the previous embodiment, the description explains that the data readout during the verify operation is carried out based on the current that passes through the bit line BL. In the sixth embodiment, the verify operation is described as being carried out based on the current that passes through the word line WL.

Figure 27:
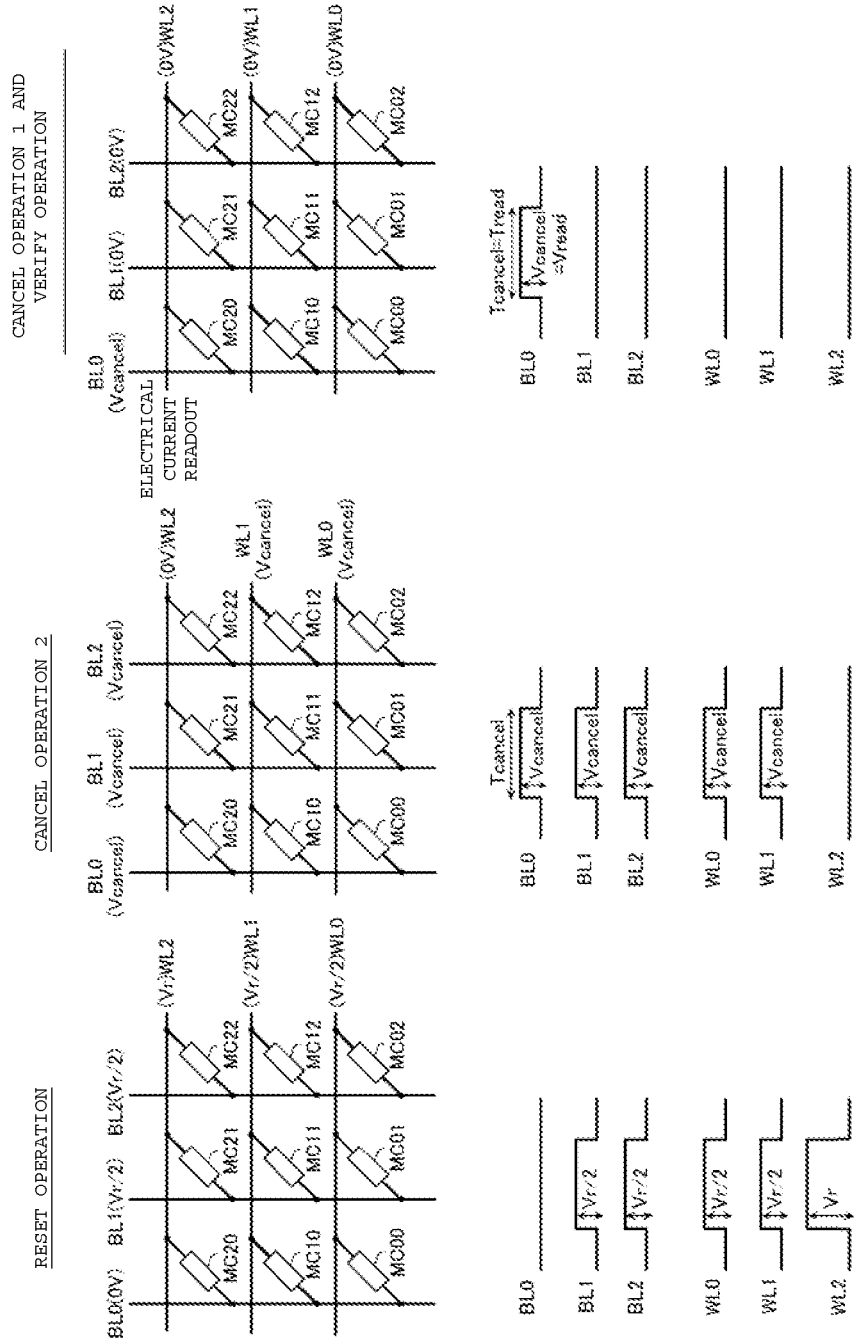
FIG. 27 is a diagram that illustrates a voltage application state during a cancel operation and a verify operation of a sixth embodiment.

FIG. 27 is a diagram that shows the voltage application state during the cancel operation and the verify operation of the present embodiment. FIG. 28 is a flow chart that explains the reset operation, the cancel operation, and the verify operation of the present embodiment. The present embodiment describes an example of executing the cancel operation on the half-selected memory cells MC21, MC22, MC10, and MC00, wherein the memory cell MC20 that is connected to the selected bit line BL0 and the selected word line WL2 is considered to be the selected memory cell MC and the reset operation is executed.

In the cancel operation and the verify operation of the present embodiment, a cancel operation 1 is executed on the half-selected memory cells MC10 and MC00 to resolve the disturbance of the variable resistance element VR, and at the same time, the verify operation is executed. When executing the cancel operation 2 that resolves the disturbance of the variable resistance element VR on the half-selected memory cells MC21 and MC22, the verify operation is not executed.

As shown in FIG. 27, in the cancel operation 1, a cancel voltage Vcancel that can resolve the disturbance of the variable resistance element VR is applied to the bit line BL0. The electric potential of the bit lines BL1 and BL2, as well as of the word lines WL0, WL1, and WL2, shall be 0 V. The application time of this voltage is the cancel voltage application time Tcancel.

This cancel voltage Vcancel is configured to be the same value as the voltage Vread that can read out data from the selected memory cell MC20. The voltage Vread is a voltage that can determine if the selected memory cell MC20 is in the set state or in the reset state. When this voltage Vread is applied, the current Iread that passes through the word line WL2 is read and compared with the acceptance value Ith. If the current that passes through the selected memory cell MC20 is less than the acceptance value Ith, a determination is made that the selected memory cell MC20 has changed to the reset state, and the operation is ended. On the other hand, if the current that passes through the selected memory cell MC20 is greater than or equal to the acceptance value Ith, a determination is made that the selected memory cell MC20 is in the set state, and the reset operation is executed again. Consequently, in the semiconductor storage device of the present embodiment, the cancel operation 1 and the verify operation are executed at the same time. In this case, the cancel voltage application time Tcancel is equivalent to the readout voltage application time Tread.

Meanwhile, voltage is not applied to the half-selected memory cells MC21 and MC22 that are connected to the word line WL2 that reads out the electric current value during this verify operation. For this reason, an electric current is not passed through the word line WL via the half-selected memory cells MC21 and MC22, and the state of the selected memory cell MC20 can be accurately read.

Figure 28:
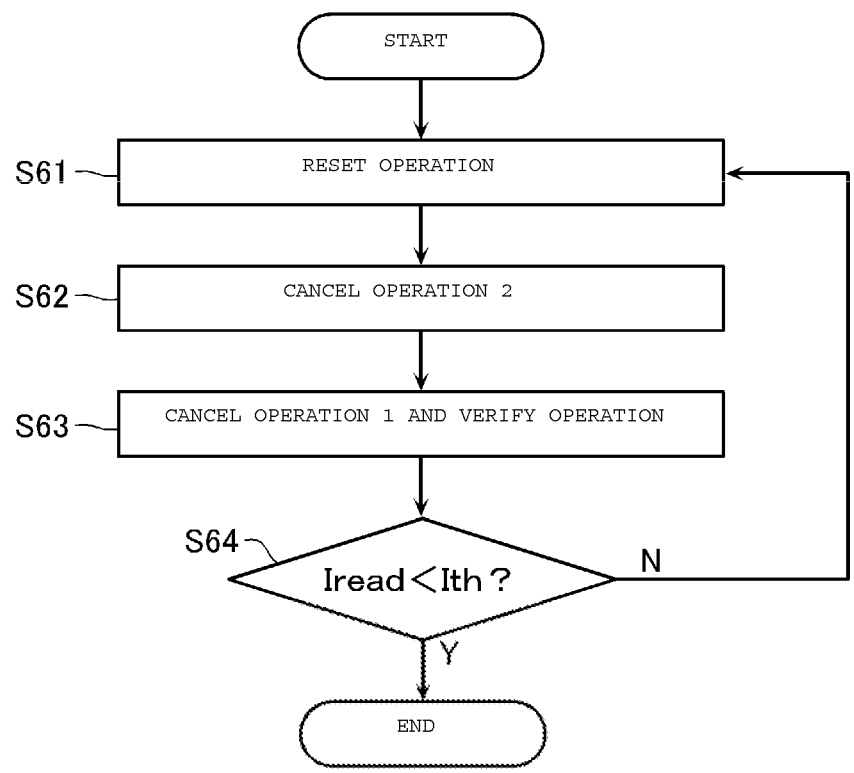
FIG. 28 is a flow chart that illustrates a process of using a memory cell of the sixth embodiment.

FIG. 28 is a flow chart that explains the reset operation, the cancel operation, and the verify operation of the sixth embodiment. When the reset operation, the cancel operation, and the verify operation are started, the reset operation is executed in step S61. At this time, the voltage application state of the memory cell array 1 is in the reset state shown in FIG. 27. Next, the cancel operation 2 is executed in step S62. At this time, the voltage application state of the memory cell array 1 is in the cancel operation 2 state shown in FIG. 27. However, when executing this cancel operation 2, the verify operation is not executed. Additionally, the cancel operation 1 and the verify operation are executed in step S63. At this time, the voltage application state of the memory cell array 1 is in the cancel operation 1 and the verify operation state shown in FIG. 27.

In step S64, the electric current Iread that passes through the word line WL2 via the selected memory cell MC20 during the verify operation and the acceptance value Ith are compared. If the electric current Iread is greater than or equal to the acceptance value Ith, a determination is made that the selected memory cell MC20 is in the set state, and the reset operation of the step S61 is executed again. On the other hand, if the electric current Iread is less than the acceptance value Ith, a determination is made that the selected memory cell MC20 has changed to the reset state, and the operation is ended.

Effects

In the semiconductor storage device according to the present embodiment, a reset operation, a cancel operation, and a verify operation are carried out. Due to the voltage application during the cancel operation, the disturbance of the variable resistance element VR of the half-selected memory cells MC is removed. Also, the cancel operation of the half-selected memory cells MC and the verify operation of the selected memory cell MC are carried out at the same time. For this reason, even when executing the verify operation on the memory cell array 1 after the reset operation, operating time is not required for the verify operation, so the operating time of the semiconductor storage device can be decreased.

In the semiconductor storage device according to the present embodiment, the current readout during the verify operation is carried out utilizing the word line WL. While the current readout during the verify operation can be carried out utilizing the word line WL, the current readout can also be executed utilizing the bit line BL, so designing the semiconductor storage device becomes easy.

Control Circuit of Sixth Embodiment

Figure 29:
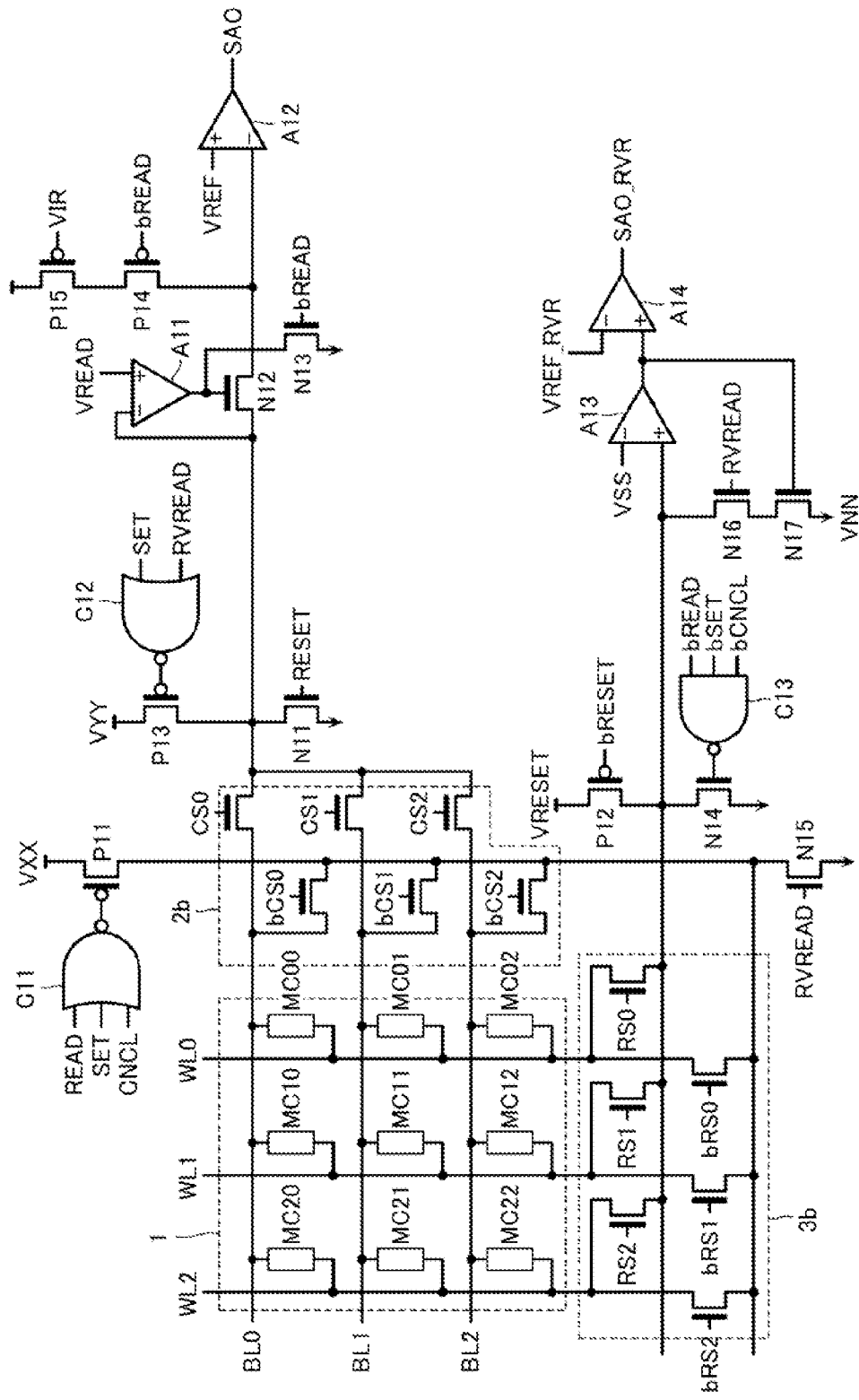
FIG. 29 is a schematic of a circuit used to control the operation of a memory cell of the sixth embodiment.

Next, the control circuit for executing the operation of the sixth embodiment is described, with reference to FIG. 29. FIG. 29 is a circuit diagram of the control circuit that controls the operation of the embodiment.

Signal READ, signal SET, signal RESET, signal CNCL, and signal RVREAD shown in FIG. 29 are each control signals that become "H" during the normal data readout operation, the set operation, the reset operation, the cancel operation, and the verify operation at the time of reset. Also, signal bREAD, signal bSET, signal bRESET, and signal bCNCL are each control signals that become "L" during the normal data readout operation, the set operation, the reset operation, and the cancel operation. With this, the circuits C11, C12, and C13 are controlled, and it becomes possible for each operation to be executed separately.

During the normal data readout operation, the power source node VXX is configured to be the voltage Vread/2, and the power source node VYY is configured to be the power source voltage VDD. During the set operation, the power source node VXX is configured to be the voltage Vs/2, and the power source node VYY is configured to be the voltage Vs. During the reset operation, the power source node VXX is configured to be the power source voltage VDD, and the power source node VYY is configured to be the power source voltage VDD. During the cancel operation, the power source node VXX is configured to be the voltage Vread, and the power source node VYY is configured to be the voltage Vread. During the verify operation, the power source node VXX is configured to be the voltage Vread, and the power source node VYY is configured to be the voltage Vread. Also, the node VNN is configured to be a negative voltage lower than the ground potential (for example, −2 V).

During the readout operation and the set operation, the voltage of the selected bit line BL is configured by the amplifier A11 and the transistors N12 and N13 for setting the voltage of the feedback-type bit line. The normal readout operation is carried out in the amplifier A12 connected to the selected bit line BL by comparing the size of the voltage of the standard voltage VREF and the drain voltage of the transistor P14 that is determined by the electrical current that transistors P15 and P14 apply, which is determined by the readout bias voltage VIR and the current that the selected memory cell MC passes according to the state. The output signal SAO of the amplifier A12 becomes the result of the readout operation. In the case when the selected memory cell MC is in the set state, the output signal SAO becomes "H," and in the case when the selected memory cell is in the reset state, the output signal SAO becomes "L."

Also, the verify operation in the amplifier A14 connected to the selected word line WL is carried out by comparing the size of the output voltage of the amplifier A13 for the grounding of the feedback-type word line and the reference voltage VREF_RVR. When the selected memory cell MC is in the reset state, the output signal SAO_RVR of the amplifier A14 becomes "L." With this control circuit, each of the operations can be executed.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a plurality of memory cells that each comprise a variable resistance element;
a plurality of first wires and a plurality of second wires, wherein each memory cell is disposed between and electrically coupled to one of the plurality of first wires and one of the plurality of second wires, and each first wire is electrically coupled to two or more memory cells and each second wire is electrically coupled to two or more memory cells; and
a control circuit that controls voltages to one of the plurality of first wires and the plurality of second wires,
wherein
during a first period, the control circuit is configured to apply a first voltage to a selected first wire of the plurality of first wires, apply a second voltage to an unselected first wire of the plurality of first wires, apply a third voltage to an unselected second wire of the plurality of second wires, and apply a fourth voltage to a selected second wire of the plurality of second wires,
during a second period after the first period, the control circuit is configured to apply a fifth voltage to the selected first wire, and apply a six voltage to the unselected first wire, the unselected second wire, and the selected second wire,
during a third period after the second period, the control circuit is configured to apply a seventh voltage to the selected first wire, the unselected first wire, the unselected second wire and apply an eighth voltage to the selected second wire,
wherein the second, third, fifth, and seventh voltages are larger than the first, sixth and eighth voltages and smaller than the fourth voltage, and
wherein a reset operation is performed during the first period and a verify operation is performed during the third period.

2. The semiconductor storage device according to claim 1, wherein
during a fourth period between the second period and the third period, the control circuit is configured to apply a ninth voltage to the unselected first wire, the unselected second wire, and the selected second wire, and apply a tenth voltage to the selected first wire, the ninth voltage being larger than the tenth voltage.

3. The semiconductor storage device according to claim 2, wherein the difference between the ninth voltage and the tenth voltage is smaller than the difference between the fourth voltage and the first voltage.

4. The semiconductor storage device according to claim 2, wherein an voltage application time of the ninth voltage is shorter than that of the fourth voltage.

5. The semiconductor storage device according to claim 2, wherein
during a fifth period after the third period, the control circuit is configured to apply the ninth voltage to the selected second wire, and apply the tenth voltage to the selected first wire, the unselected first wire, and the unselected second wire.

6. The semiconductor storage device according to claim 5, wherein the difference between the ninth voltage and the tenth voltage is smaller than the difference between the fourth voltage and the first voltage.

7. The semiconductor storage device according to claim 5, wherein an voltage application time of the ninth voltage is shorter than that of the fourth voltage.

8. A semiconductor storage device, comprising:
a plurality of memory cells that each comprise a variable resistance element;
a plurality of first wires and a plurality of second wires, wherein each memory cell is disposed between and electrically coupled to one of the plurality of first wires and one of the plurality of second wires, and each first wire is electrically coupled to two or more memory cells and each second wire is electrically coupled to two or more memory cells; and
a control circuit that controls voltages to one of the plurality of first wires and the plurality of second wires,
wherein
during a first period, the control circuit is configured to apply a first voltage to a selected first wire of the plurality of first wires, apply a second voltage to an unselected first wire of the plurality of first wires, apply a third voltage to an unselected second wire of the plurality of second wires, and apply a fourth voltage to a selected second wire of the plurality of second wires,
during a second period after the first period, the control circuit is configured to apply a fifth voltage to the selected first wire, and apply a six voltage to the unselected first wire, the unselected second wire, and the selected second wire,
during a third period after the second period, the control circuit is configured to apply a seventh voltage to the selected first wire, the unselected first wire, the unselected second wire and apply an eighth voltage to the selected second wire,
wherein the second, third, sixth, and seventh voltages are larger than the first and eighth voltages and smaller than the fourth and fifth voltages, and
wherein a reset operation is performed during the first period and a verify operation is performed during the third period.

9. The semiconductor storage device according to claim 8, wherein
during a fourth period between the second period and the third period, the control circuit is configured to apply a ninth voltage to the unselected first wire, the unselected second wire, and the selected second wire, and apply a tenth voltage to the selected first wire, the ninth voltage being larger than the tenth voltage.

10. The semiconductor storage device according to claim 9, wherein the difference between the ninth voltage and the tenth voltage is smaller than the difference between the fourth voltage and the first voltage.

11. The semiconductor storage device according to claim 9, wherein an voltage application time of the ninth voltage is shorter than that of the fourth voltage.

12. The semiconductor storage device according to claim 9, wherein
during a fifth period after the third period, the control circuit is configured to apply the ninth voltage to the selected second wire, and apply the tenth voltage to the selected first wire, the unselected first wire, and the unselected second wire.

13. The semiconductor storage device according to claim 12, wherein the difference between the ninth voltage and the tenth voltage is smaller than the difference between the fourth voltage and the first voltage.

14. The semiconductor storage device according to claim 12, wherein an voltage application time of the ninth voltage is shorter than that of the fourth voltage.

15. A semiconductor storage device, comprising:
a plurality of memory cells that each comprise a variable resistance element;
a plurality of first wires and a plurality of second wires, wherein each memory cell is disposed between and electrically coupled to one of the plurality of first wires and one of the plurality of second wires, and each first wire is electrically coupled to two or more memory cells and each second wire is electrically coupled to two or more memory cells; and
a control circuit that controls voltages to one of the plurality of first wires and the plurality of second wires,
wherein
during a first period, the control circuit is configured to apply a first voltage to a selected first wire of the plurality of first wires, apply a second voltage to an unselected first wire of the plurality of first wires, apply a third voltage to an unselected second wire of the plurality of second wires, and apply a fourth voltage to a selected second wire of the plurality of second wires,
during a second period after the first period, the control circuit is configured to apply a fifth voltage to the selected first wire, the unselected first wire, and the unselected second wire, and apply a six voltage to the selected second wire,
during a third period after the second period, the control circuit is configured to apply a seventh voltage to the selected first wire, and apply an eighth voltage to the unselected first wire, the unselected second wire, and the selected second wire,
wherein the second and third voltages are larger than the first, sixth and eighth voltages and smaller than the fourth voltage, and the fifth and seventh voltages are larger than the sixth and eighth voltages,
wherein a reset operation is performed during the first period and a verify operation is performed during the third period.

16. The semiconductor storage device according to claim 15, wherein
during a fourth period between the second period and the third period, the control circuit is configured to apply a ninth voltage to the unselected first wire, the unselected second wire, and the selected second wire, and apply a tenth voltage to the selected first wire, the ninth voltage being larger than the tenth voltage.

17. The semiconductor storage device according to claim 16, wherein the difference between the ninth voltage and the tenth voltage is smaller than the difference between the fourth voltage and the first voltage.

18. The semiconductor storage device according to claim 16, wherein an voltage application time of the ninth voltage is shorter than that of the fourth voltage.

19. The semiconductor storage device according to claim 16, wherein
during a fifth period after the third period, the control circuit is configured to apply the ninth voltage to the selected second wire, and apply the tenth voltage to the selected first wire, the unselected first wire, and the unselected second wire.

20. The semiconductor storage device according to claim 19, wherein the difference between the ninth voltage and the tenth voltage is smaller than the difference between the fourth voltage and the first voltage.

21. The semiconductor storage device according to claim 19, wherein an voltage application time of the ninth voltage is shorter than that of the fourth voltage.

* * * * *